(12) United States Patent
Kato et al.

(10) Patent No.: US 6,515,900 B2
(45) Date of Patent: Feb. 4, 2003

(54) NON-VOLATILE MEMORY WITH BACKGROUND OPERATION FUNCTION

(75) Inventors: Tamiyu Kato, Hyogo (JP); Tomoshi Futatsuya, Hyogo (JP); Yoshikazu Miyawaki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/832,986

(22) Filed: Apr. 12, 2001

(65) Prior Publication Data

US 2001/0050860 A1 Dec. 13, 2001

(30) Foreign Application Priority Data

Jun. 9, 2000 (JP) ........................................ 2000-173504

(51) Int. Cl.$^7$ ............................................... G11C 11/34
(52) U.S. Cl. .................... 365/185.11; 365/233
(58) Field of Search ............................ 365/233, 185.11

(56) References Cited

U.S. PATENT DOCUMENTS 6,166,990 A * 12/2000 Ooishi et al. ................ 365/233

FOREIGN PATENT DOCUMENTS

JP          11-126497        5/1999

* cited by examiner

*Primary Examiner*—M. Tran
(74) *Attorney, Agent, or Firm*—McDermott, Will & Emery

(57) ABSTRACT

A non-volatile semiconductor memory device includes a bank pointer, in which a signal for designating an operating mode to be performed is generated according to coincidence/non-coincidence of prescribed bits of address signals supplied from an address buffer, and the generated signal is supplied to an internal control circuit. Thus, necessary data can be read out from the non-volatile semiconductor memory device at high speed, so that usability of the device is improved.

11 Claims, 20 Drawing Sheets

READ MODE CAN BE SWITCHED EVEN IN THE SAME BANK

NON-VOLATILE MEMORY WITH BACKGROUND OPERATION FUNCTION

BACKGROUND OF THE INVENTION

1. Field of the Invention

The present invention relates to non-volatile semiconductor memory devices, and particularly to a multi-bank, non-volatile semiconductor memory device having a plurality of banks. More particularly, the present invention relates to a flash memory (background operation (BGO) flash memory) having background operation function that allows, while an internal operation such as erasing/programming operation is being performed with respect to one bank, data to be read out from another bank.

2. Description of the Background Art

FIG. 25 schematically shows an entire configuration of a conventional BGO flash memory. Referring to FIG. 25, the conventional BGO flash memory includes a plurality of banks B#1–B#4. These banks B#1–B#4, each addressable independently of others, have essentially an identical configuration. Thus, in FIG. 25, reference characters for internal components of only bank B#1 are representatively denoted.

Banks B#1–B#4 each include: a memory array MA having a plurality of non-volatile memory cells arranged in rows and columns; a pre-decoder PD that pre-decodes an internal address signal from an address buffer 901; a row decoder RD that decodes an internal row address (pre-decoded) signal from pre-decoder PD and selects an addressed row in memory array MA; a column decoder CD that decodes an internal column address signal (pre-decoded signal) from pre-decoder PD and generates a column select signal for selecting an addressed column in memory array MA; a Y gate YG for selecting a column in memory array MA according to the column select signal from column decoder CD; and a sense amplifier SA that senses and amplifies data on the column selected by Y gate YG.

Each of these banks B#1–B#4 is further provided with a write circuit for transmitting a voltage corresponding to write data to a selected memory cell (bit line) in a write mode. The write circuit, however, is not shown in FIG. 25 for simplification of the drawing.

The non-volatile semiconductor memory device further includes: a bank pointer 903 that decodes a bank address signal included in the internal address signal from address buffer 901 and generates a bank designating signal for selectively activating banks B#1–B#4; an internal control circuit 900 that takes in an externally supplied command CMD according to a control signal CTL and generates various internal control signals for performing an operating mode designated by the command CMD; a data buffer 913 that takes in externally supplied data according to control signal CTL and generates internal write data, and externally outputs the data in a read mode; a write data buffer 904 provided corresponding to banks B#1 and B#3 and latches the data supplied from data buffer 913 in a write mode; an erase/program verify circuit 905 provided corresponding to banks B#1 and B#3 and detects, in the erasing/programming operation, whether the erasing and programming operations are performed accurately; a write data buffer 906 provided corresponding to banks B#2 and B#4 and latches the internal write data from data buffer 913; and an erase/program verify circuit 907 for detecting, in the erasing/programming operation of bank B#2 or B#4, whether the erasing or the programming is performed accurately in the selected bank.

The write data in write data buffer 904 is supplied to the write circuits (not shown) of banks B#1 and B#3, and an internal voltage corresponding to the write data is transmitted to an internal data line (bit line). Likewise, write data buffer 906 supplies the write data to the write circuits (not shown) of banks B#2 and B#4, and a voltage corresponding to the write data is transmitted to a selected column of bank B#2 or B#4.

In erasing/programming operation, the erasing and programming operations differ for different types of flash memories. In a NOR type flash memory, the erasing operation is an operation of lowering a threshold voltage of a transistor in a memory cell, which is done by drawing electrons out of a floating gate of the memory cell transistor. In a DINOR type flash memory, the erasing operation is an operation of raising the threshold voltage of the memory cell transistor by injecting electrons into the floating gate of the memory cell transistor. Likewise, in the programming operation, the threshold voltage of the memory cell transistor is raised in the NOR type flash memory, whereas the threshold voltage is lowered in the DINOR type flash memory.

In the erasing/programming operation, internal control circuit 900 performs, according to a verify result designating signal from erase/program verify circuit 905 or 907, the erasing/programming operation repeatedly until the erasure or program is carried out accurately. In addition, internal control circuit 900 causes address buffer 901 to take in an externally supplied address signal AD according to command CMD and to generate, in the internal operation, an internal control address signal according to the address taken in.

Address buffer 901 generates both an internal address signal corresponding to the externally supplied address signal AD and the internal control address signal generated under the control of internal control circuit 900. Bank pointer 903 can generate, according to the internal address signal and the internal control address signal from address buffer 901, both an internal operating bank designating signal and a bank designating signal corresponding to the external address signal. By generating both the internal address signal corresponding to the external address signal AD and the internal control address signal generated under the control of internal control circuit 900, it becomes possible, while the internal operation such as erasing/programming operation is being performed in one bank, to access another bank for reading out memory cell data.

The non-volatile semiconductor memory device further includes: a register circuit 908 that stores a device production code (ID code) specific to the device; a register circuit 909 that stores common flash interface (CFI) codes (normally 32 kinds of data) such as an erase cycle time and storage capacity; a register circuit 910 that stores status data indicating operating states of the banks; a register circuit 911 that stores lock bits indicating presence/absence of lock in banks B#1–B#4 on a block basis; and an output switching circuit 912 that selects, according to a read mode switching signal RSW from internal control circuit 900, one of data Di read out from these register circuits 908–911 and banks B#1–B#4, for application to data buffer 913.

In this non-volatile semiconductor memory device, during the time where the erasing/programming operation is being performed in one bank, it is possible to access another bank or status register circuit 910 to read out necessary data. Such function (capability) that enables, while an internal operation is being performed in one bank, data to be read out from a circuit (the status register circuit or a bank) other than the bank currently subject to the internal operation, is called background operation (BGO) function (capability). Generally in a non-volatile semiconductor memory device, while data reading is done at a speed as high as 50 ns (nano seconds) to 100 ns, the erasing/programming operation requires a relatively long time on the order of 2 µs to 5 s. By enabling the access to one bank or the status register circuit during the erasing/programming operation of another bank, wait time of the system decreases, thereby improving processing efficiency of the system.

To perform such internal operation and data reading on a bank basis, each bank is provided with a sense amplifier SA.

FIG. 26 schematically shows a configuration of address buffer 901 shown in FIG. 25. Referring to FIG. 26, address buffer 901 includes: a NAND circuit 901a that receives external address signal AD and an address buffer activating signal ABE; an inverter 901b that inverts the output signal of NAND circuit 901a to generate an intermediate address signal ADi; two-stage, cascaded inverters 901c and 901d that receive intermediate address signal ADi output from inverter 901b to generate an external reading address signal AE; and an address latch 901e that receives the internal control address signal ICAD from internal control circuit 900 and intermediate address signal ADi, takes in a received address signal according to an external address latch enable signal EALE and an internal control address latch enable signal IALE, and generates an internal control address signal AI.

Address buffer activating signal ABE is activated according to control signal CTL (chip enable signal /CE, write enable signal /WE, and output enable signal /OE). External address latch enable signal EALE is activated when command CMD is externally supplied. Internal control address latch enable signal IALE is activated upon execution of the internal operation. Internal control address signal ICAD is generated in data reading in a page mode, for example, by internally updating the address signal in a sequential manner, with external address signal AD being a leading address. Upon erasing/programming operation (in the case where the erasing is to be performed on the block basis), a block address signal is generated from external address signal AD for performing an erasing on the block basis.

FIG. 27 shows a configuration of address latch 901e shown in FIG. 26. Referring to FIG. 27, address latch 901e includes: a transfer gate 920a that is rendered conductive in response to activation (an H level) of external address latch enable signal EALE, to pass intermediate address signal ADi; a transfer gate 920b that is rendered conductive upon activation (an H level) of internal control address latch enable signal IALE to pass internal control address signal ICAD; a NAND circuit 920c having a first input receiving an address signal supplied from one of transfer gates 920a and 920b, and a second input receiving a reset signal ZRST; an inverter 920e that inverts the output signal of NAND circuit 920c to generate internal control address signal AI (for use in internal control); and an inverter 920d that inverts the output signal of NAND circuit 920c to feed back the inverted signal to the first input of NAND circuit 920c. Reset signal ZRST is activated (or driven to an L level) upon completion of an internal operation or upon reception of a new command. When reset signal ZRST is activated to the L level, all the bits of internal control address signal AI are set to an L level.

From address latch 901e, either the internal control address signal corresponding to external address signal AD or the internal control address signal ICAD processed by internal control circuit 900 is selected and output as the address signal AI for the internal operation.

More specifically, as shown in FIG. 28, upon the application of command CMD, external address signal AD is also applied at the same time. External address signal AD and command CMD are latched by internal control circuit 900 at a rise of control signal CTL. According to the control signal CTL (/CE, /WE, /OE) upon application of the command CMD, address buffer activating signal ABE is activated, and intermediate address signal ADi is generated according to external address signal AD. Then, according to the decode result of command CMD, external address latch enable signal EALE is activated, and transfer gate 920a is rendered conductive. Internal control address signal AI (AD0) is thus generated according to external address signal AD (intermediate address signal ADi).

When the page mode operation or the erasing/programming operation is designated by command CMD, internal control address signal ICAD is updated under the control of the internal control circuit 900. In such internal operation, internal control address latch enable signal IALE is activated under the control of internal control circuit 900, and transfer gate 920b is rendered conductive. Thus, internal control address signal AI is changed to internal control address signal ICAD (0) applied from internal control circuit 900.

Address signals AE and AI from address buffer 901 shown in FIG. 26 are both applied to bank pointer 903 shown in FIG. 25. According to these address signals AE and AI, bank pointer 903 generates bank designating signals for specifying the banks for external data reading and for internal operation, respectively.

FIG. 29 shows a configuration of bank pointer 903 shown in FIG. 25. Bank pointer 903 includes: gate circuits 903a–903d that decode most significant two bits AE<m:m−1> of external reading address signal bits AE<m:0> to generate bank designating signals AEB1–AEB4, respectively; and gate circuits 903e–903h that generate bank designating signals AIB1–AIB4 for control of internal operation according to most significant two bits AI<m:m−1> of internal control address signal bits AI<m:0>. Address signals AE and AI each are a signal of (m+1) bits. The number of banks is four, and an address of two bits is used for specifying a bank.

Gate circuit 903a drives bank designating signal AEB1 to an active state of an H level when address bits AE<m> and AE<m−1> are both at an L level. Gate circuit 903b drives bank designating signal AEB2 to an active state of an H level when address bit AE<m> is at an L level and address bit AE<m−1> is at an H level. Gate circuit 903c drives bank designating signal AEB3 to an active state of an H level when address bit AE<m> is at an H level and address bit AE<m−1> is at an L level. Gate circuit 903d drives bank designating signal AEB4 to an active state of an H level when address bits AE<m> and AE<m−1> are both at an H level. These bank designating signals AEB1–AEB4 designate banks B#1–B#4, respectively.

Gate circuit 903e drives bank designating signal AIB1 to an active state of an H level when address bits AI<m> and AI<m−1> are both at an L level. Gate circuit 903f drives bank designating signal AIB2 to an active state of an H level when address bits AI<m> is at an L level and address bit AI<m−1> is at an H level. Gate circuit 903g drives bank designating signal AIB3 to an active state of an H level when address bit AI<m> is at an H level and address bit AI<m−1> is at an L level. Gate circuit 903h drives bank designating signal AIB4 to an active state of an H level when address bits AI<m> and A<m−1> are both at an H level. Bank designating signals AIB1–AIB4 designate banks B#1–B#4, respectively.

As shown in FIG. 29, in bank pointer 903, bank designating signals AEB1–AEB4 for external reading are generated based on external reading address signal AE, and bank designating signals AIB1–AIB4 for internal operation are generated based on internal control address signal AI. Thus, the internal operation and the external data reading operation can be performed in parallel.

FIG. 30 schematically shows a configuration of a bank activating unit. Referring to FIG. 30, bank B#i (i=1 to 4) is activated upon activation of a bank specifying signal BPi that is output from an OR circuit 925 receiving bank designating signals AEBi and AIBi. When bank specifying signal BPi is activated, address decode circuitry (predecoder PD, column decoder CD and row decoder RD) are activated in bank B#i, and a memory cell selecting operation is performed according to the address signal supplied.

FIG. 31 schematically shows a configuration of sense amplifier SA in one bank. Referring to FIG. 31, sense amplifier SA includes: a sense circuit 926 that is activated in response to activation of a sense amplifier activating signal ZSE and senses and amplifies data supplied from the Y gate; an internal read circuit 927 that is activated upon activation of an external read activating signal RDE and transmits the data sensed and amplified by sense circuit 926 to the data buffer; and a verify read circuit 928 that is activated in response to activation of a verify read activating signal VRDE and supplies the data sensed and amplified by sense circuit 926 to the erase/program verify circuit.

External read activating signal RDE is generated based on bank designating signal AEB, while verify read activating signal VRDE is generated based on internal operating bank designating signal AIB. More specifically, when bank designating signal AEBi is activated, internal read circuit 927 associated with bank B#i is activated, and selected memory cell data is supplied to the data buffer for externally reading out the data. When internal operating bank designating signal AIBi is activated, the operation of bank B#i is controlled by internal control circuit 900. When erasing and programming are performed and the erase/program verifying operation is performed, verify read activating signal VRDE is activated for verification of the erase/program. Sense activating signal ZSE is activated under the control of internal control circuit 900, when either one of bank designating signals AEBi and AIBi is activated.

FIG. 32 schematically shows configurations of internal control circuit 900 and output switching circuit 912 shown in FIG. 25. Referring to FIG. 32, internal control circuit 900 includes: a command decoder 900a that takes in externally supplied command CMD according to control signal CTL, and generates a signal designating an internal operation designated by the command CMD; an internal control signal generating circuit 900b that generates various internal control signals according to the internal operation designating signal from command decoder 900a; a coincidence detecting circuit 900c that detects coincidence/non-coincidence of bank designating signals AEB (AEB1–AEB4) and AIB (AIB1–AIB4) at the time of the internal operation; and a status data control circuit 900d that generates, upon detection of the coincidence by coincidence detecting circuit 900c, status data of the designated bank under the control of internal control signal generating circuit 900b, and writes the generated data to status register 910.

Internal control signal generating circuit 900b generates, in accordance with the operating mode designating signal from command decoder 900a and the coincidence/non-coincidence detecting signal from coincidence detecting circuit 900c, a main sense amplifier activating signal ZSEM, an internal read activating signal RDEM, and a verify read activating signal VRDEM, an output mode switching signal RSW. These activating signals ZSEM, RDEM and VRDEM are main control signals. Logical products of these signals with the bank designating signal are taken to generate sense amplifier activating signal ZSE, external read activating signal RDE and verify read activating signal VRDE, respectively, for the designated bank.

When a bank undergoing an internal operation is designated by an externally supplied address, internal control signal generating circuit 900b activates status data control circuit 900d, generates data indicating the status (progress of erasing/programming) in that bank, and writes the generated data via status data control circuit 900d to status data register 910. At the time of detection of the coincidence, internal control signal generating circuit 900b sets read mode switching signal RSW to a state allowing selection of status data register 910. Upon command application, an operation according to the command is performed.

Output switching circuit 912 includes transfer gates TX1–TX4 provided corresponding to respective register circuits 908, 909, 910 and 911, and a transfer gate TX5 receiving read data Di from a selected bank. One of these transfer gates TX1–TX5 is activated according to read mode switching signal RSW. These transfer gates TX1–TX5 may be tri-state buffer circuits. Now, an operation of the circuit shown in FIG. 32 will be described with reference to the flow chart shown in FIG. 33.

Here, in FIG. 33, an operation for reading out memory cell data or data stored in a register circuit from the nonvolatile semiconductor memory device will be described.

A determination is made whether a command is externally applied (step S1). When a read command for reading out data is externally supplied, first, a determination is made whether there is a bank currently subject to an internal operation (step S2). If there is no bank in progress of the internal operation, the command supplied is decoded, and an operation designated by the command is performed (step S8). At this time, read mode switching signal RSW is also set according to the command supplied (step S9). Thereafter, data (memory cell data or data in a register circuit) is selected by output switching circuit 912 according to the command supplied, and the selected data is externally output via data buffer 913.

In step S2, if it is determined that there is a bank currently under the internal operation (by making a determination that there is an internal operating bank designating signal AIB in an active state), a further determination is made whether the address signal simultaneously supplied with the command designates the bank currently in progress of the internal operation by coincidence detecting circuit 900c (step S3). If a bank other than the bank subject to the internal operation is designated, the command CMD is a memory cell reading command. In response, an array read mode is set (step S6), memory cell selection and data reading are performed according to the externally supplied address signal (step S7), and the memory cell data is externally output via data buffer 913 (step S10).

In step S3, if the bank currently subject to the internal operation is designated by the externally supplied address signal, coincidence detecting circuit 900c detects such coincidence, and status data control circuit 900d generates status data. This data indicating the status of the bank undergoing the internal operation is written and stored in status register circuit 910. Thereafter, read mode switching signal RSW is forcibly set to the state for selection of status register circuit 910, and transfer gate TX3 is rendered conductive (step S5). The status data stored in status data register circuit 910 is then externally output via data buffer 913 (step S10).

Note that the array read mode is set in step S6. In this case, an operation of externally supplying the signals designating data reading (/OE, /CE in an active state) along with the address signal may be performed (the array read mode is set in advance). In other words, there is a case where data reading is performed simply by activating output enable signal /OE.

Thus, as shown in FIG. 32, external reading bank designating signal AEB and internal operating bank designating signal AIB are generated to activate the banks designated by these bank designating signals. Accordingly, it is possible to perform, during an internal operation in one bank, data reading in another bank.

In a BGO flash memory, a background operation is possible in which, during an internal operation in one bank, another bank is accessed for data reading. In the case of the prior art, however, operating modes are limited to the one for reading data from another bank, or the one for reading out the status data of the bank in progress of the internal operation. This is because the original object of the background operation is to improve access efficiency by allowing, during the erasing/programming period of one bank, reading of data stored in another bank. Thus, in the case described above, data cannot be read out from register circuits 908, 909 and 911 during the background operation, or more specifically, it is not possible to perform an operation of reading out, e.g., a block lock bit to check a rewritable region in each bank. This limits the application of the background operation function. This poses a problem that the application of the background operation function is limited.

In addition, to set the operation content of read, a command must be externally supplied to re-set the state of read mode switching signal RSW. In this case, after the application of the read command, output enable signal /OE must be activated to designate the data output, so that two cycles are required. Thus, the internal data reading takes time. (This poses another problem that the internal data reading takes a relatively long time.)

More specifically, once the state of read mode switching signal RSW is set by a read command, such state of the signal RSW is maintained continuously. To sequentially read out the CFI code, block lock bit and status data, it is necessary to apply, for each operation, a command designating reading of the corresponding data, and thereafter, it is also necessary to activate output enable signal /OE for each data output. Thus, the necessary internal data cannot be read out at high speed. The same applies to memory cell data reading.

Further, in a normal flash memory without the BGO capability, register circuits storing various kinds of specific data are provided. In this case, during the internal operation in which erasing or programming is internally performed, an externally output ready/busy signal is set at a busy state. Only when the ready/busy signal attains a ready state, data such as status data can be read out. In this case as well, to read out specific data in a specific internal register circuit, it is necessary to apply a command specifying the register circuit, and after a command latching/decoding operation, the output enable signal (included in control signal CTL) must be set to an active state. Thus, fast reading of such specific data is not possible.

SUMMARY OF THE INVENTION

An object of the present invention is to provide a non-volatile semiconductor memory device allowing reduction of time required for reading out necessary data.

Another object of the present invention is to provide a non-volatile semiconductor memory device capable of reading out any desired data externally at high speed.

A further object of the present invention is to provide a non-volatile semiconductor memory device with excellent usability.

The non-volatile semiconductor memory device according to a first aspect of the present invention includes: a circuit generating an operating mode designating signal that designates one operating mode from a plurality of operating modes according to a prescribed bit of an externally supplied address signal; and an operation control circuit generating a control signal for performing the operating mode designated according to the operating mode designating signal.

The non-volatile semiconductor memory device according to another aspect of the present invention includes: circuitry for detecting a change of a value of a prescribed bit in successive multi-bit address signals; and circuitry for setting an operating mode, upon detection of the change of the value of the prescribed bit in the address signals, according to the prescribed bit of a latter address signal of the successive multi-bit address signals.

Preferably, the non-volatile semiconductor memory device has background operation function, and sets an operation being performed in the background operation according to the prescribed bit value of the address signal.

As the content of the read mode is determined according to the prescribed bit of the address signal, necessary data can be read out externally at high speed, with no need of application of a command.

In addition, by setting the content of read mode with a command once, it is possible to externally read out necessary data simply by changing a value of the prescribed bit of an address signal upon and/or after the execution of the internal operation. Thus, even in a time period other than that of the background operation, necessary data can be read out at high speed, an increased number of kinds of data can be externally read out, so that the usability of the device is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
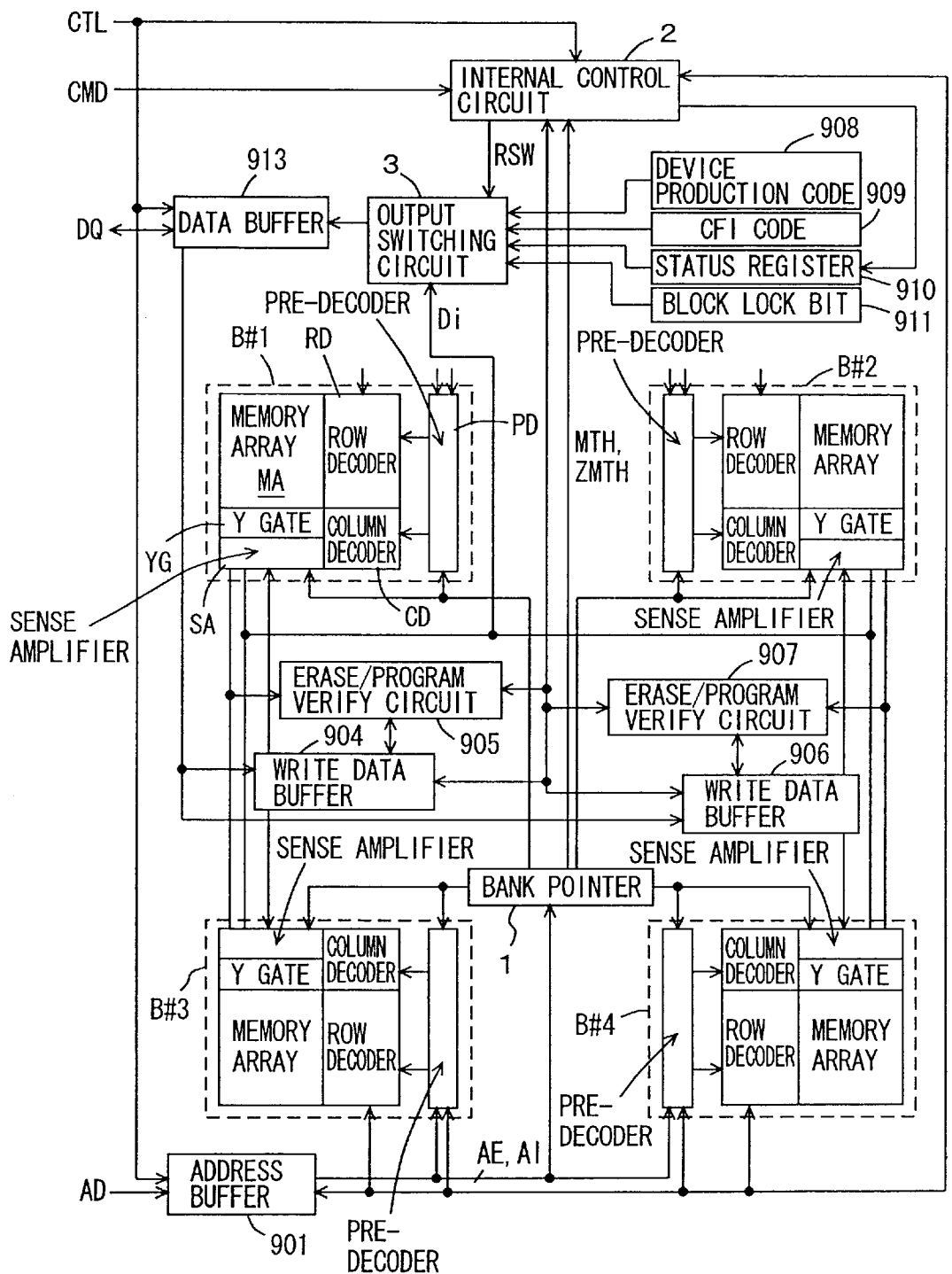
FIG. 1 schematically shows an entire configuration of a non-volatile semiconductor memory device according to a first embodiment of the present invention.

The non-volatile semiconductor memory device according to the first embodiment will be described with reference to FIG. 1. The non-volatile semiconductor memory device shown in FIG. 1 is a BGO flash memory. In the BGO flash memory shown in FIG. 1, a bank pointer 1 has bank coincidence detecting capability of, upon receiving bank addresses included in address signals AE and AI from address buffer 901, detecting whether or not the bank address signal for the external operation and the bank address signal for the internal operation are designating the same bank. Bank designating signals AEB1–AEB4 are supplied from bank pointer 1 to banks B#1–B#4, respectively, as in the conventional manner. A coincidence detecting signal MTH and a non-coincidence detecting signal ZMTH are supplied from bank pointer 1 to an internal control circuit 2.

Internal control circuit 2 performs, in response to coincidence detecting signal MTH and non-coincidence detecting signal ZMTH, the following operations. When coincidence detecting signal MTH is activated, internal control circuit 2 performs an operating mode designated by externally supplied command CMD. On the other hand, upon activation of non-coincidence detecting signal ZMTH, internal control circuit 2 sets an array read mode in which data of a memory cell in the bank designated by externally supplied address signal AD is read out.

Figure 25:
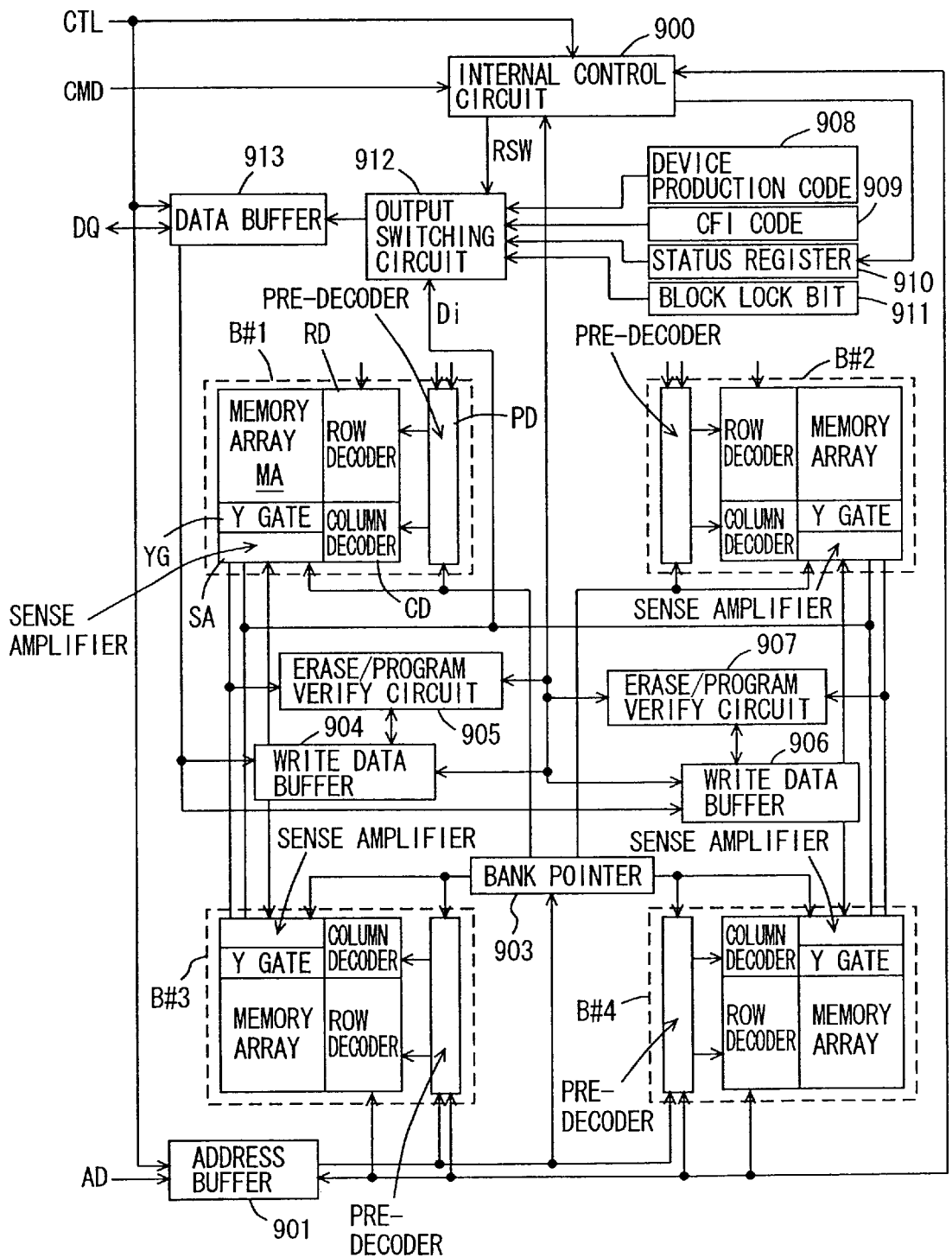
FIG. 25 schematically shows an entire configuration of a conventional non-volatile semiconductor memory device.

Output switching circuit 3 selects, according to the read mode switching signal RSW from internal control circuit 2, either one of the data from register circuits 908–911 and read data Di from a selected memory cell for application to data buffer 913. As for the other portions, the configuration of the BGO flash memory according to the first embodiment is identical to that of the conventional BGO flash memory shown in FIG. 25. Thus, corresponding portions are denoted by the same reference characters, and detailed description thereof is not repeated.

Figure 2:
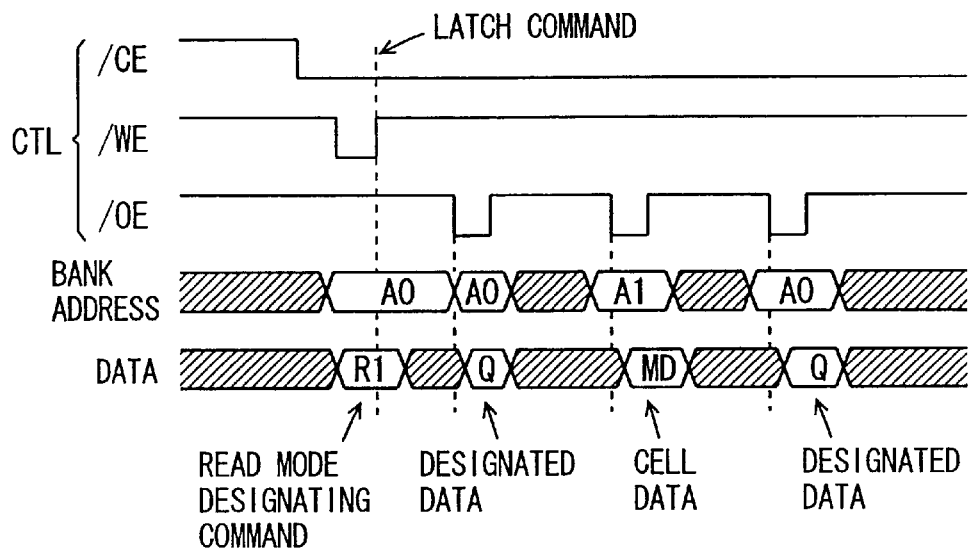
FIG. 2 is a timing chart illustrating an operation of the non-volatile semiconductor memory device shown in FIG. 1.

Now, the operation of the BGO flash memory shown in FIG. 1 will be described with reference to the timing chart shown in FIG. 2. Referring to FIG. 2, control signal CTL includes a chip enable signal /CE, a write enable signal /WE and an output enable signal /OE. Command CMD is supplied via a data bus.

First, chip enable signal /CE is set to an active state of an L level, so that the instant BGO flash memory is selected. Write enable signal /WE is then set to an L level, and output enable signal /OE is set to an H level. According to the activation of chip enable signal /CE and write enable signal /WE, externally supplied address signal AD and command CMD supplied via the data bus are internally taken in, and are latched in response to a rise of write enable signal /WE. In this command latching cycle, external operating address signal AE and internal control address signal AI from address buffer 901 designate the same bank (see FIG. 27). Thus, bank pointer 1 drives coincidence detecting signal MTH to an active state to indicate the coincidence of bank designating signals AEB and AIB. In response to the activation of coincidence detecting signal MTH, internal control circuit 2 performs an operation designated by the command CMD. In addition, read mode switching signal RWS is set according to command CMD. FIG. 2 illustrates a state where read mode designating command R1 is applied.

Then, under the condition where the same bank is being designated, when output enable signal /OE is driven to an active state of an L level, data buffer 913 is activated, and data Q selected by output switching circuit 3 is externally output. This data Q is data designated by read mode designating command R1, and is either data from register circuits 908–911 or read data Di from a selected memory cell.

Next, output enable signal /OE is set to an active state of an L level, and the bank address is set to a state designating another bank. In FIG. 2, bank address A1 is supplied. This bank address A1 is different from the previous bank address, A0, applied at the time when the read mode designating command R1 was supplied. Thus, in this case, internal control circuit 2 designates an array read mode, and performs a memory selecting operation according to externally supplied address signal AD, and causes output switching circuit 3 to select data Di read out from the selected memory cell. Therefore, in this case, memory cell data MD is externally output from data buffer 913.

Output enable signal /OE is again set to an active state of an L level, and bank address A0 is supplied. This bank address A0 is the same as the bank address applied at the time when the read mode designating mode R1 was supplied. In this case, data reading is performed again according to the operating mode designated by the read mode designating command R1. Thus, simply by switching the bank address signal, it is possible to read out any one of device production code (ID code), common flash interface code (CFI code), status data, block lock bit and selected memory cell data. In other words, once the read mode is designated, in the following cycles, desired data can be read out only by changing the bank address signal. Accordingly, it is unnecessary to apply commands for respective read mode operations, so that necessary data can be read out at high speed.

The conventional BGO flash memory allowed, in the background operation, only an operating mode for reading out the status data and an operating mode for reading data of a memory cell in another bank. According to the first embodiment, however, by setting, in advance, which data is to be read out from register circuits 908–911 by read mode designating command R1, it is possible, in the subsequent background operation modes, to read out any of ID code, CFI code, status data and block lock bit from register circuits 908–911. Accordingly, the contents of read mode become expanded as compared to the case of conventional BGO flash memory, data can be read out as required, so that usability of the memory is improved.

Figure 3:
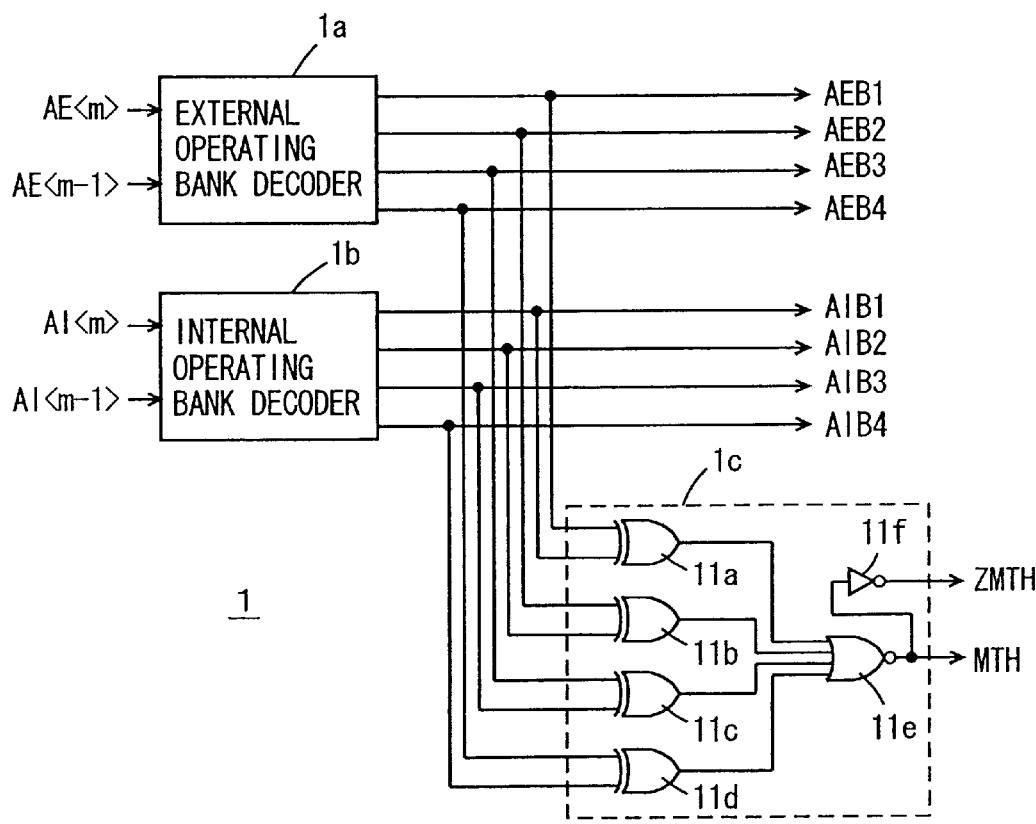
FIG. 3 shows a configuration of a bank pointer shown in FIG. 1.

Referring to FIG. 3, bank pointer 1 shown in FIG. 1 includes: an external operating bank decoder 1a (for an external operation) that decodes external operating address signal bits AE<m> and AE<m−1> to generate external operating bank designating signals AEB1–AEB4; an internal operating bank decoder 1b (for an internal operation) that decodes internal control address signal bits AI<m> and AI<m−1> to generate internal operating bank designating signals AIB1–AIB4; and a coincidence/noncoincidence detecting circuit 1c that detects coincidence/non-coincidence between bank designating signals AEB1–AEB4 and AIB1–AIB4 from bank decoders 1a and 1b.

Figure 29:
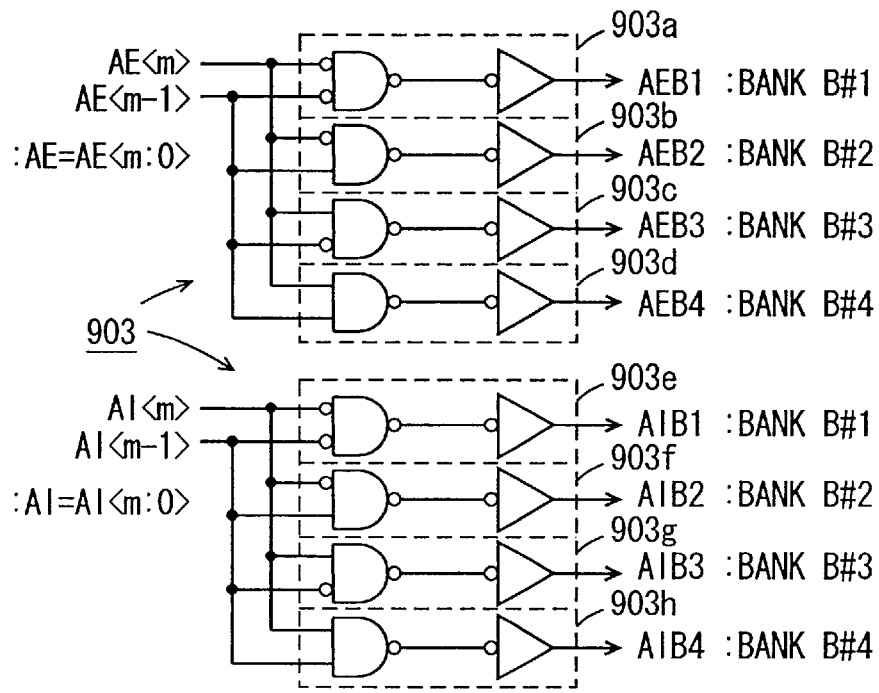
FIG. 29 shows a configuration of a bank pointer shown in FIG. 25.
Figure 30:
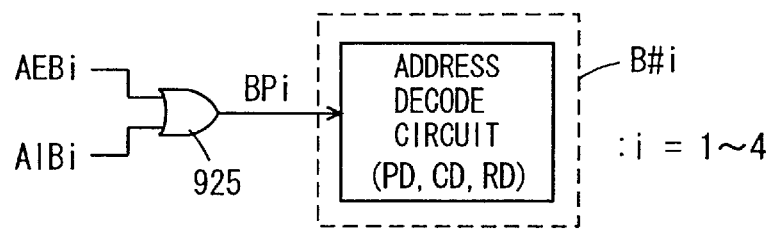
FIG. 30 schematically shows a configuration of an activation unit of a conventional address decode circuit.
Figure 31:
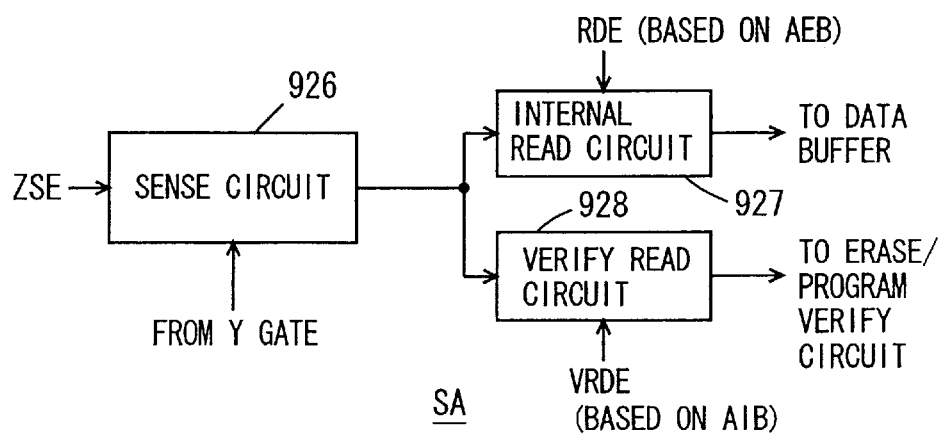
FIG. 31 schematically shows a configuration of a sense amplifier shown in FIG. 25.

External operating bank decoder 1a and internal operating bank decoder 1b each have a configuration identical to the decoder included in the conventional bank pointer 903 shown in FIG. 30. More specifically, external operating bank decoder 1a corresponds to decode circuits 903a–903d shown in FIG. 29, and internal operating bank decoder 1b corresponds to decode circuits 903e–903h shown in FIG. 29.

Coincidence/non-coincidence detecting circuit 1c includes: an EXOR circuit 11a receiving bank designating signals AEB1 and AIB1; an EXOR circuit 11b receiving bank designating signals AEB2 and AIB2; an EXOR circuit 11c receiving bank designating signals AEB3 and AIB3; an EXOR circuit 11d receiving bank designating signals AEB4 and AIB4; an NOR circuit 11e receiving the output signals from EXOR circuits 11a–11d to generate coincidence detecting signal MTH; and an inverter circuit 11f inverting the output signal from NOR circuit 11e to generate non-coincidence detecting signal ZMTH.

Figure 26:
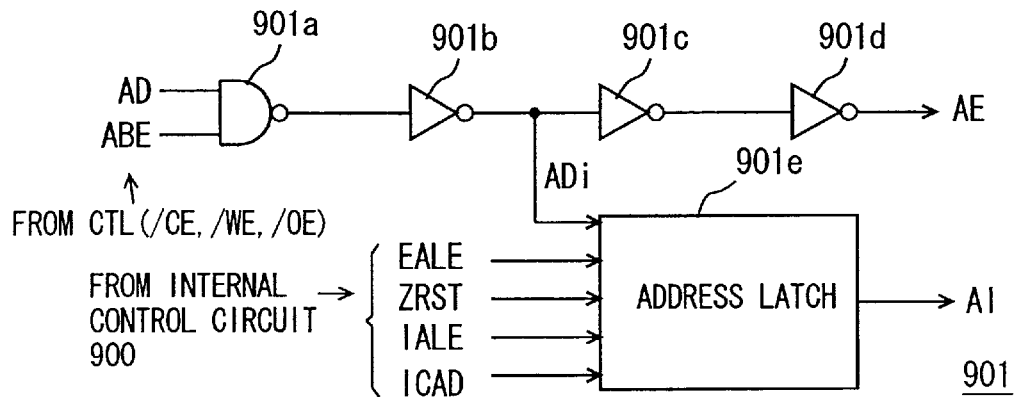
FIG. 26 schematically shows a configuration of an address buffer shown in FIG. 25.
Figure 27:
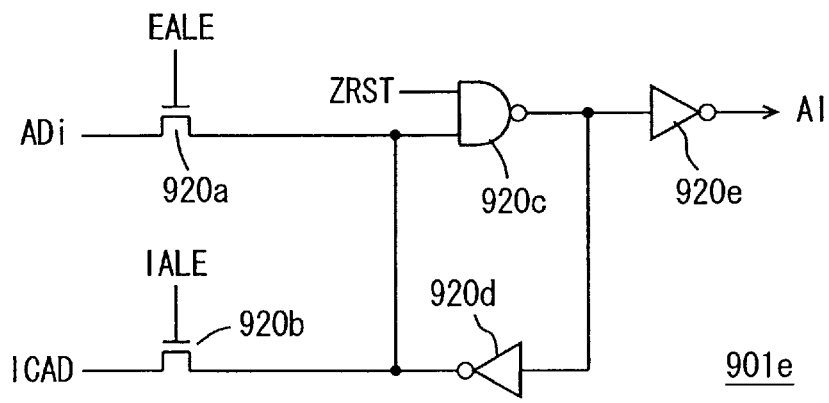
FIG. 27 shows a configuration of an address latch shown in FIG. 26.
Figure 28:
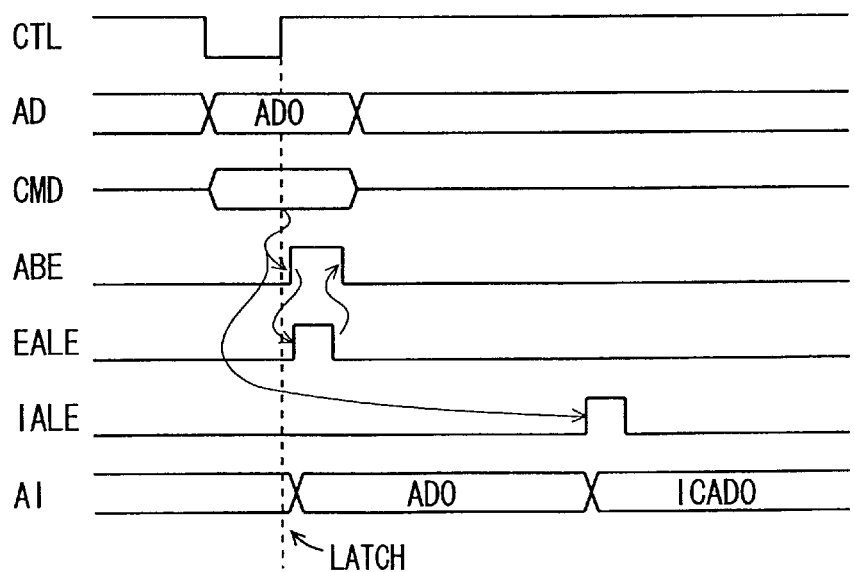
FIG. 28 is a timing chart illustrating an operation of the address buffer shown in FIGS. 26 and 27.

At the time of command application, as shown in FIGS. 26–28, address buffer 901 takes in external address signal AD and generates external operating address signal AE and internal operating address signal AI. Therefore, at the time of command application, external operating address signal AE and internal operating address signal AI are the same, and bank designating signals AEBi (i is any of 1 to 4) and AIBi both attain an H level. In this case, as the remaining bank designating signals are all at an L level, EXOR circuits 11a–11d all attain a coincidence detection state, and thus, the output signals from EXOR circuits 11a–11d are all at an L level. In response, coincidence detecting signal MTH output from NOR circuit 11e attains an H level, and non-coincidence detecting signal ZMTH from inverter circuit 91f attains an L level. In response to coincidence detecting signal MTH, internal control circuit 2 performs an operation according to the externally supplied command.

When the erasing/programming is performed by command application, the internal operating address signal AI is updated, whereas the internal operating bank address is not updated. Thus, internal operating bank designating signal AIBi maintains the selected state (see FIG. 27). Next, when a bank address signal designating another bank is supplied, the output signals of two of four EXOR circuits 11a–11d attain an H level, and the output signals from the remaining two EXOR circuits attain an L level. In response, coincidence detecting signal MTH from NOR circuit 11e attains an L level, and non-coincidence detecting signal ZMTH from inverter circuit 11f attains an H level.

Thus, by latching the internal control address signal in address buffer 900, as shown in FIGS. 26 and 27, reading of necessary data can be performed simply by supplying control signals CTL (of which output enable signal /OE and chip enable signal /CE are at an L level) and an address signal.

Accordingly, by supplying a read mode designating command and a bank address designating the bank subject to the internal operation before execution of the internal operation (erasing or programming operation), it is possible to set the content of the background operation in execution of the internal operation.

Figure 4:
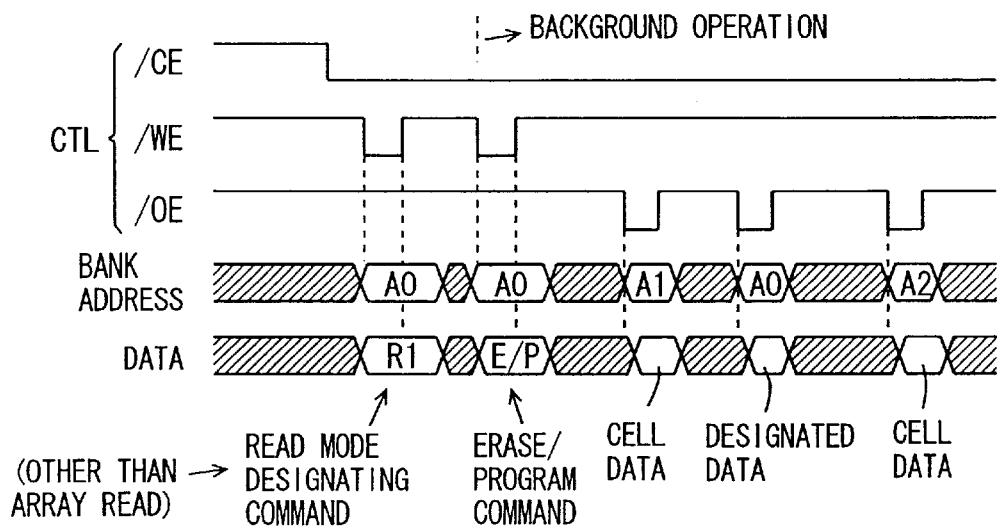
FIG. 4 is a timing chart illustrating a background operation of the non-volatile semiconductor memory device shown in FIG. 1.

More specifically, as shown in FIG. 4, before application of an erase/program command E/P, a bank address signal (bank address signal A0) specifying the bank subject to the erase/program as well as a read mode designating command are supplied. This read mode designating command is a command designating an operating mode other than the array read mode, and specifically designates a mode of reading out data from any of register circuits 908–911. After setting the read mode content, erase/program command E/P is supplied, and thus, the erasing/programming is performed on the bank designated by bank address signal A0.

Thereafter, bank address signal AI is supplied and the data output mode is set (by setting output enable signal /OE to an L level). In this case, bank address signal A1 different from bank address signal A0 is being supplied, and non-coincidence detecting signal ZMTH is activated. Thus, data of the memory bank designated by bank address signal A1 is read out. Thereafter, when bank address signal A0 is supplied and data reading is designated (by setting output enable signal /OE to an L level), data of any of register circuits 908–911 is read out according to the mode designated by read mode designating command R1. When bank address signal A2 is supplied again, data of a memory cell in the bank designated by bank address signal A2 is read out.

Accordingly, by supplying a read mode designating command to set the content of registers to be read out before execution of the internal erasing/programming operation, it becomes possible to read out data other than the status data in background operation. Further, at this time, output enable signal /OE is simply activated. It is unnecessary to apply a new command for designating the read mode. Thus, it becomes possible to obtain necessary data at the background operation at high speed.

Figure 5:
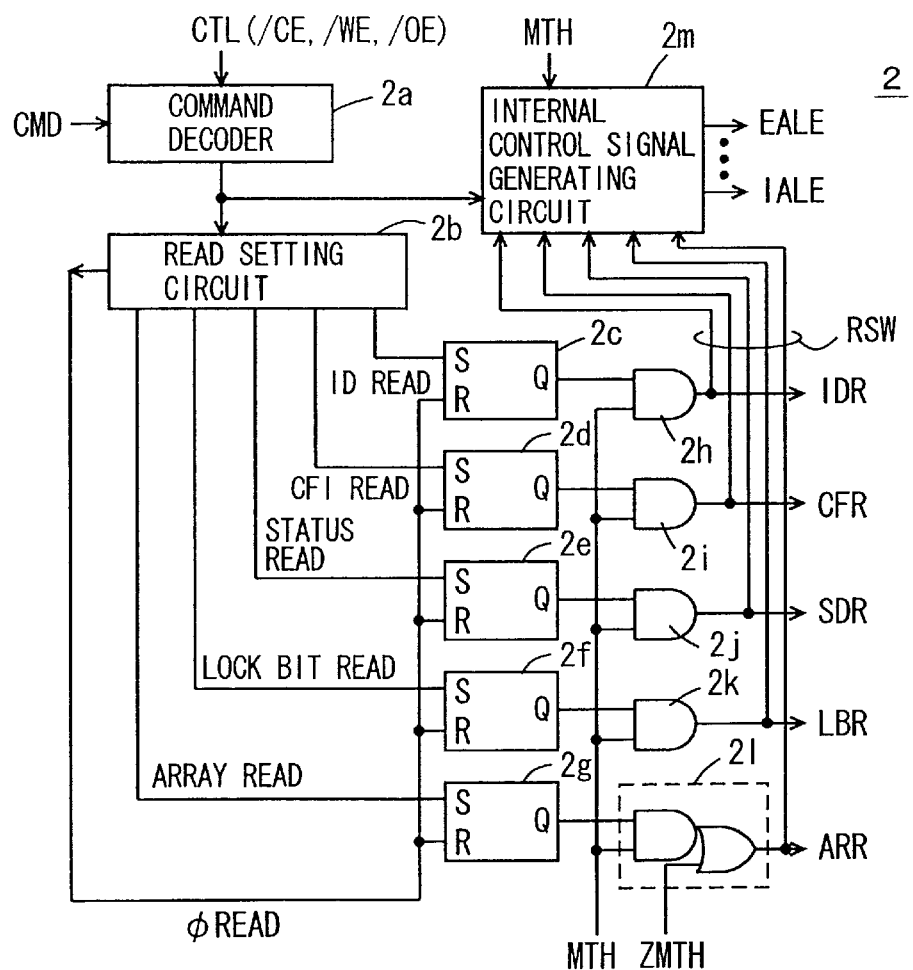
FIG. 5 schematically shows a configuration of an internal control circuit shown in FIG. 1.

FIG. 5 schematically shows, by way of example, a configuration of a unit related to data reading within internal control circuit 2 of FIG. 1. Referring to FIG. 5, internal control circuit 2 includes: a command decoder 2a that takes in and decodes externally supplied command CMD according to control signal CTL (/CE, /WE, /OE); a read setting circuit 2b that activates a read mode specifying signal according to the read mode designating signal from command decoder 2a; set/reset flip-flops 2c–2g that are set in response to the output signal of read setting circuit 2b and reset in response to a read command detecting signal φREAD from read setting circuit 2b; AND circuits 2h–2k provided corresponding to set/reset flip-flops 2c–2f, respectively; and a composite gate 21 provided corresponding to set/reset flip-flop 2g.

Set/reset flip-flop 2c is set in response to activation of an ID code read designating signal from read setting circuit 2b. Set/reset flip-flop 2d is set in response to activation of a CFI code read designating signal from read setting circuit 2b. Set/reset flip-flop 2e is set in response to activation of a status data read designating signal from read setting circuit 2b. Set/reset flip-flop 2f is set in response to activation of a block lock bit read designating signal from read setting circuit 2b. Set/reset flip-flop 2g is set in response to activation of an array read designating signal from read setting circuit 2b. Read mode detecting signal φREAD is activated when any of these register read commands or the array read command designating the memory cell data reading is supplied, and resets set/reset flip-flops 2c–2g when activated.

AND circuit 2h receives the output signal from set/reset flip-flop 2c and coincidence detecting signal MTH and generates an ID code read signal IDR. AND circuit 2i receives the output signal of set/reset flip-flop 2d and coincidence detecting signal MTH and generates a CFI code read signal CFR. AND circuit 2j receives the output signal of set/reset flip-flop 2e and coincidence detecting signal MTH and generates a status data read signal STR. AND circuit 2k receives the output signal of set/reset flip-flop 2f and coincidence detecting signal MTH and generates a lock bit read signal LBR.

Composite gate 21 receives the output signal of set/reset flip-flop 2g, coincidence detecting signal MTH and non-coincidence detecting signal ZMTH, and generates a memory cell data read signal ARR. Composite gate 21 activates memory cell data read signal ARR according to the output signal of set/reset flip-flop 2g in activation of coincidence detecting signal MTH. In activation of non-coincidence detecting signal ZMTH, composite gate 21 drives memory cell data read signal ARR to an active state, regardless of the state of set/reset flip-flop 2g.

Internal control circuit 2 further includes an internal control signal generating circuit 2m that receives a command (erase/program command) from command decoder 2a and the output signals of AND circuits 2h–2k and of composite gate 21, and generates various internal control signals. Those signals output from internal control signal generating circuit 2m include external address latch enable signal EALE, internal control address latch enable signal IALE, sense amplifier activating signal. When a read mode is to be used, internal control signal generating circuit 2m further performs an operation necessary for realizing the designated read mode. For example, when status data read signal SDR is activated, an operation of writing status data indicating the state of erasing/programming of the designated bank to the status data register is performed. When memory cell data read signal ARR is activated, internal control signal generating circuit 2m generates control the signals and voltages necessary for the memory cell selecting operation in the selected bank (operations such as selection of word line, selection of bit line, activation of sense amplifier, generation of program voltage, and so on).

Figure 32:
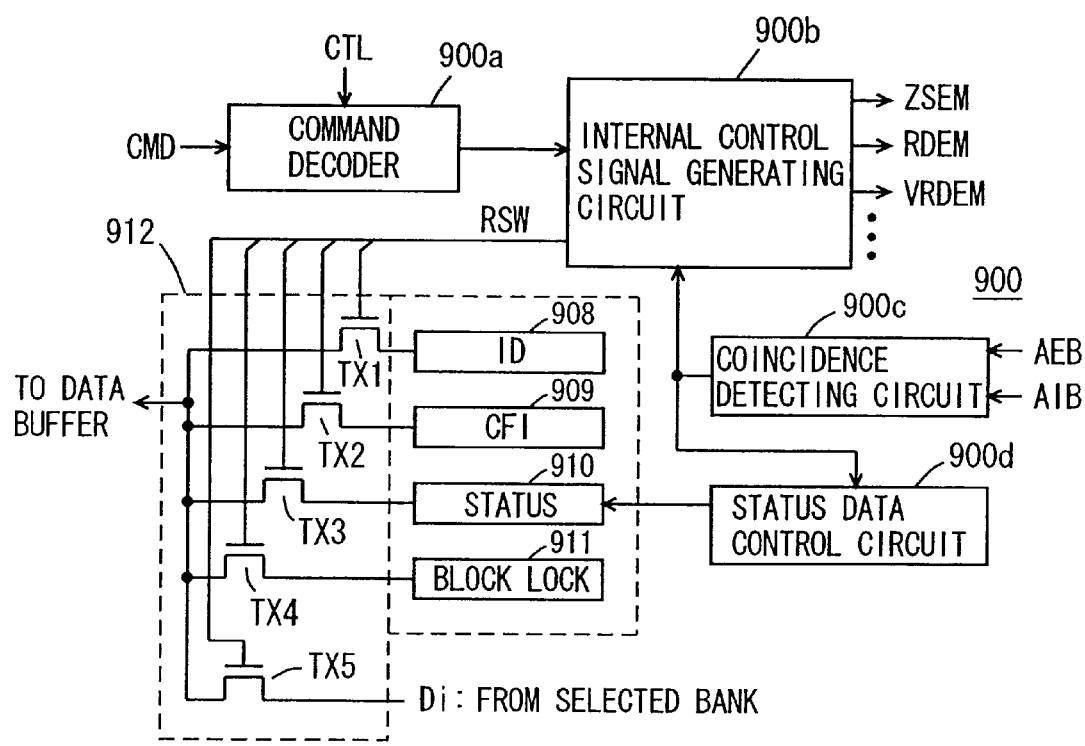
FIG. 32 schematically shows a configuration of an output switching circuit and an internal control circuit shown in FIG. 25.
Figure 33:
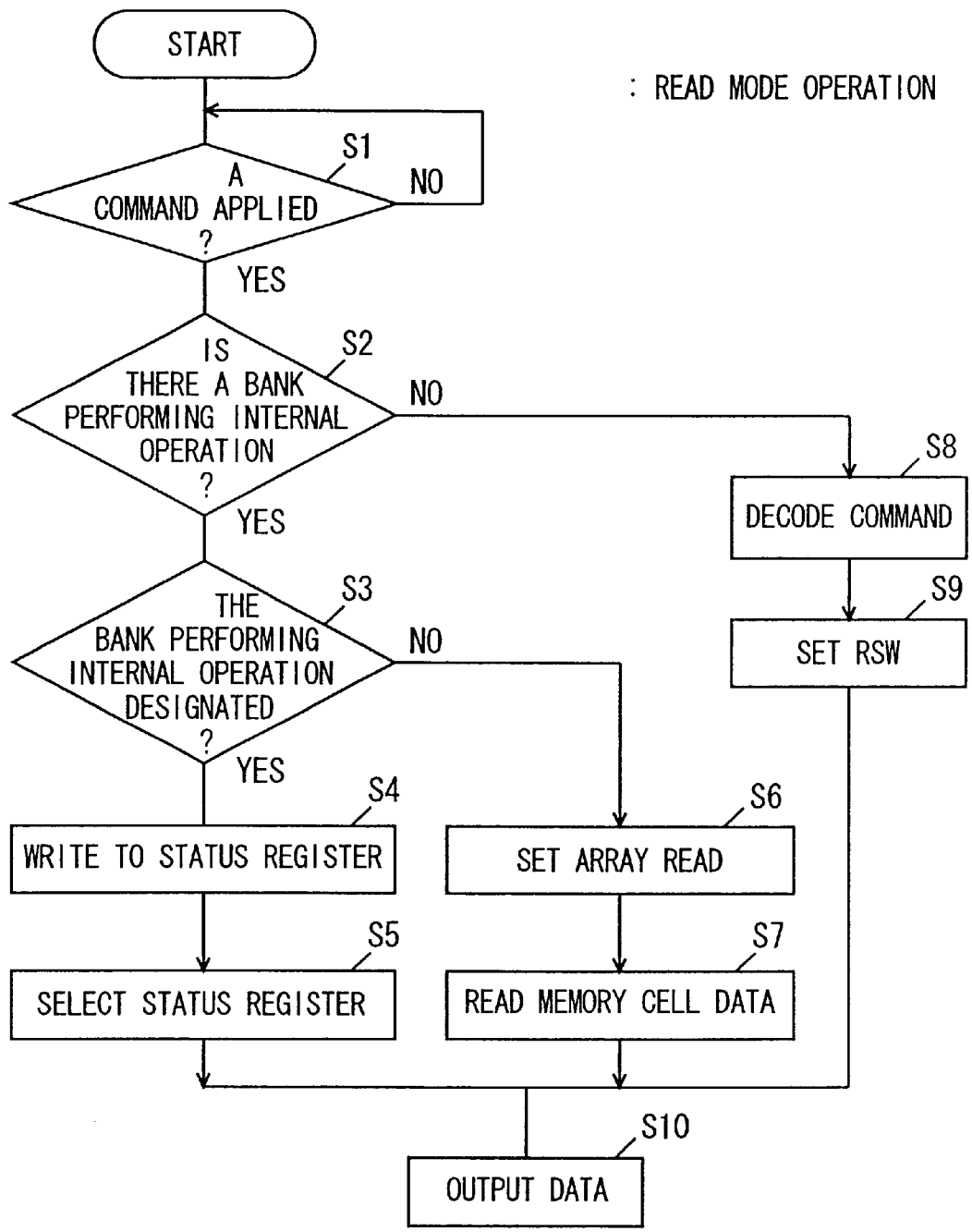
FIG. 33 is a flow chart illustrating an operation of the conventional non-volatile semiconductor memory device.

In FIG. 5, read signals IDR, CFR, SDR, LBR and ARR from AND circuits 2h–2k and composite gate circuit 21 are shown to be applied as read mode switching signal RSW to output switching circuit 3. Read mode switching signal RSW, however, may be generated from internal control signal generating circuit 2m and applied to output mode switching circuit 3. The configuration of output mode switching circuit 3 is equivalent to the one shown in FIG. 32.

Figure 6:
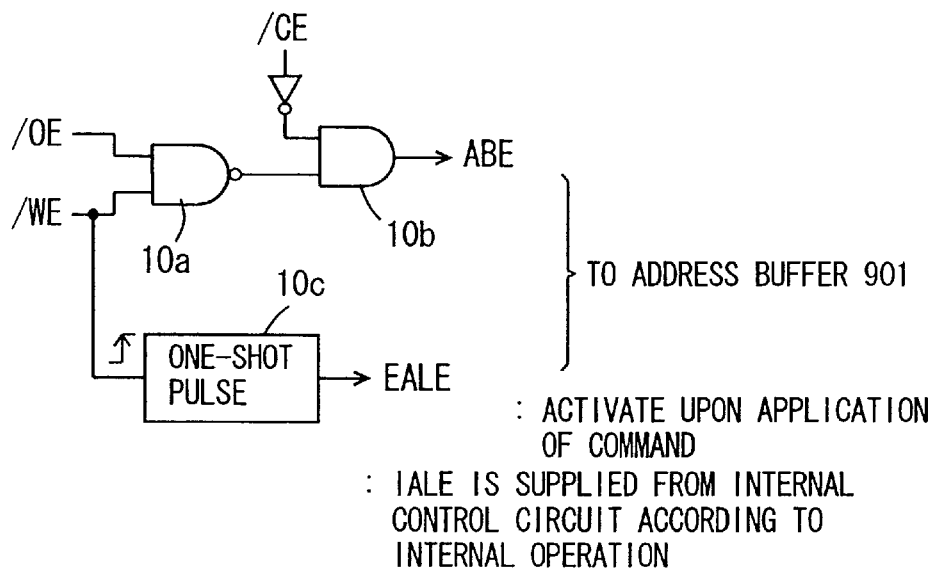
FIG. 6 schematically shows a configuration of an address control unit of the internal control circuit shown in FIG. 1.

FIG. 6 shows a configuration of a unit generating a control signal for address buffer 901 shown in FIG. 1. Referring to FIG. 6, the address control signal generating unit includes: a NAND circuit 10a that receives output enable signal /OE and write enable signal /WE; an AND circuit 10b that receives the output signal of NAND circuit 10a and the inverted signal of chip enable signal /CE to generate address buffer activating signal ABE; and a one-shot pulse generating circuit 10c that generates a one-shot pulse in response to a rise of write enable signal /WE. External address latch enable signal EALE is generated from this one-shot pulse generating circuit 10c.

When chip enable signal /CE is at an inactive state of an H level, address buffer activating signal ABE is at an inactive state of an L level. When chip enable signal /CE attains an L level, address buffer activating signal ABE is activated in response to a fall of either one of output enable signal /OE and write enable signal /WE, and thus, externally supplied address signal AD is taken in.

One-shot pulse generating circuit 10c generates external address latch enable signal EALE in response to a rise of write enable signal /WE. Thus, external address latch enable signal EALE is activated upon command application, and internal control address signal AI is generated according to external address signal AD. More specifically, upon command application, internal control address signal AI is regularly generated according to external address signal AD. Internal control address latch enable signal IALE is activated under the control of internal control circuit 2, according to the state of internal operation. Thus, unless a new command is applied, the bank address signal of the internal control address signal is unchangedly maintained at the latched state (the internal control address signal changes only within the same bank).

First Modification

Figure 7:
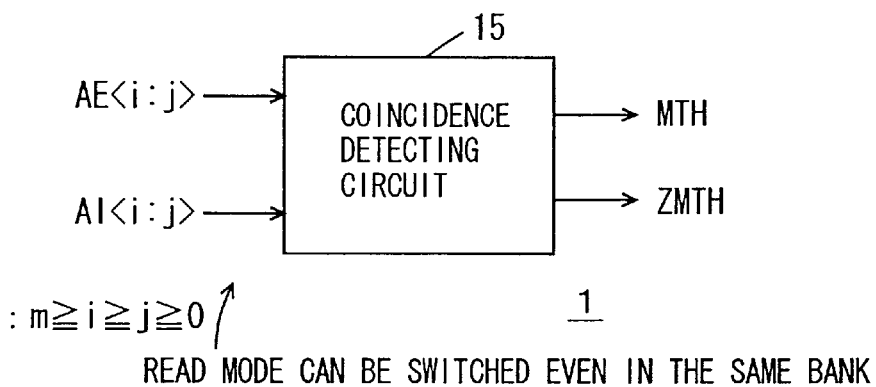
FIG. 7 schematically shows a configuration of a first modification of the first embodiment.

FIG. 7 schematically shows a configuration of a bank pointer according to the first modification of the first embodiment. Coincidence detecting circuit 15 of bank pointer 1 is shown in FIG. 7. Coincidence detecting circuit 15 receives external address signal bits AE<i: j> and internal control address signal bits AI<i: j>, and generates coincidence detecting signal MTH and non-coincidence detecting signal ZMTH. Coincidence detecting circuit 15 performs bit-to-bit comparison of address signal bits AE<i: j> and AI<i: j>. Here, i and j satisfy the relation expressed as $m \geq i \geq j \geq 0$.

With the configuration as shown in FIG. 7, the content of read mode is not changed on the bank basis, but can be switched on the basis of a range defined by address signal bits AE<i: j>. Thus, even when the same bank is being designated, the read mode can be switched by the address signal bit(s). Accordingly, for example, during the time when data of one page is being read out in a page mode, if an address signal designating another page is applied, necessary data can be read out according to a pre-set read mode.

Second Modification

Figure 8:
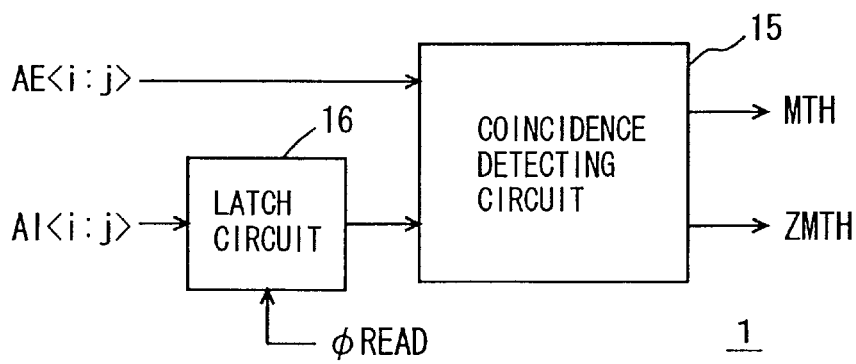
FIG. 8 schematically shows a configuration of a second modification of the first embodiment.

FIG. 8 shows a configuration of the second modification of the first embodiment. In the configuration shown in FIG. 8, bank pointer 1 includes: a latch circuit 16 that latches internal control address signal bits AI<i:j> in response to activation of read command detecting signal φREAD; and a coincidence detecting circuit 15 that detects coincidence/non-coincidence between the latched bits at latch circuit 16 and external address signal bits AI<i:j>. In the configuration shown in FIG. 8, address signal bits AI<i:j> are latched at latch circuit 16 until a new read command is supplied. Accordingly, in a background operation, if a bank other than the bank subject to the internal operation is designated, and a read mode content is set to a read mode other than the array read mode, it becomes possible to perform an operating mode for reading out data other than memory cell data even in such a case where the other bank is designated as a target of the background operation mode. This is because it is unnecessary to select, as a bank for the internal (erasing/programming) operation, a bank the same as the one specified by the bank address that was applied theretofore simultaneously with the read command upon setting of the read mode.

Figure 9:
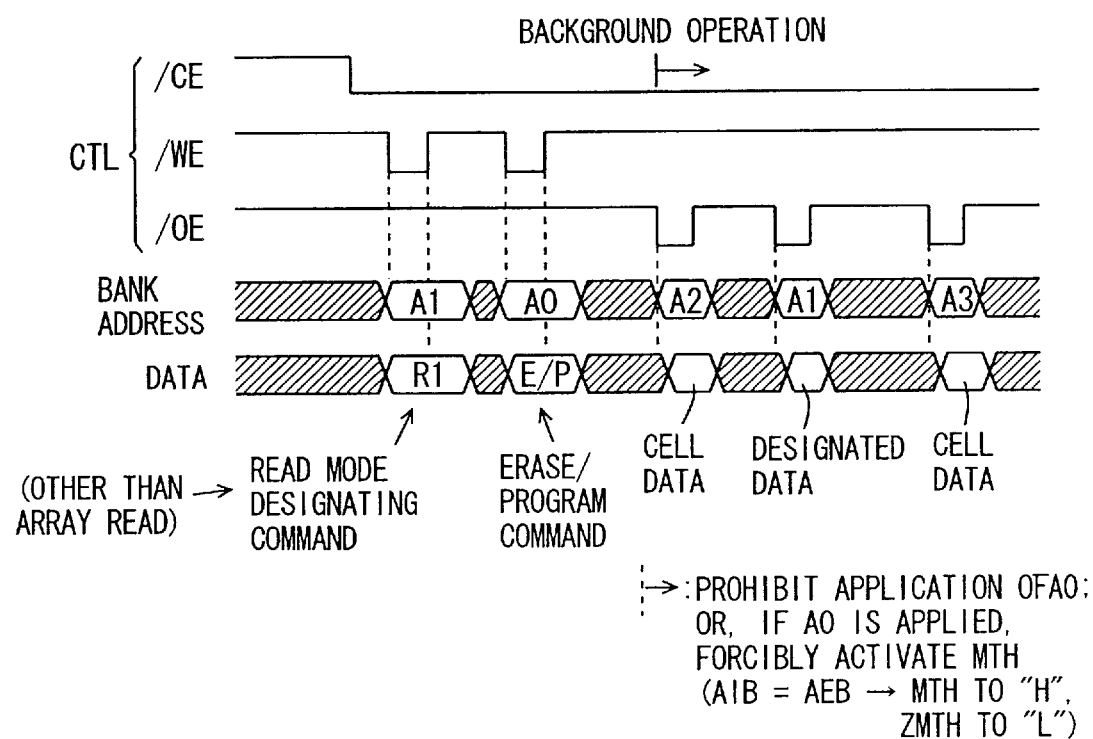
FIG. 9 is a timing chart illustrating an operation of the second modification of the first embodiment.

More specifically, as shown in FIG. 9, assume that bank address signal A1 and read mode designating command R1 are applied, and then, bank address signal A0 and erase/program command E/P are applied. In this case, if the bank address signal A2 is applied in the background operation, bank address signals A1 and A2 designate banks different from each other, and thus, memory cell data in the bank designated by bank address signal A2 is read out. On the contrary, if bank address signal A1 is applied, as it is the same as the bank address signal at the time of application of read mode designating command, data is read out according to the mode designated by the read mode designating command. When bank address signal A3 is applied, again, memory cell data of the bank designated by the bank address signal A3 is read out.

In the configurations as shown in FIGS. 8 and 9, in the background operation, application of bank address signal A0 is prohibited, or, when bank address signal A0 is applied, coincidence detecting signal MTH is forcibly driven to an active state. The configuration for such forcible activation of coincidence detecting signal MTH determines the forcible activation/inactivation according to coincidence/non-coincidence between bank designating signal AEB designated by external address signal AE and bank designating signal AIB designated by the bank address signal of internal control address signal AI. If AIB=AEB, coincidence detecting signal MTH is forcibly activated. In this case, non-coincidence detecting signal ZMTH is forcibly inactivated.

Alternatively, if command R1 designates the array read mode, when AIB=AEB, a mode other than the array read mode, such as a status data read mode, may be forcibly set as default.

Thus, with the configuration of the second modification, it is unnecessary to make the bank address at the time of application of read mode setting command coincide with the bank address for specification of a bank for performing the internal operation. Thus, restriction on the address control is alleviated.

It should be noted that, when the number of memory banks exceeds four, the number of bank address signal bits being applied to the bank pointer increases. This only increases the number of bank designating signals, and in response, the number of EXOR circuits included in the coincidence detecting circuit shown in FIG. 3 simply increases.

As described above, according to the first embodiment of the present invention, an internal operating mode is switched in the bank pointer according to coincidence/non-coincidence between a prescribed number of bit(s) of the internal control address signal and a prescribed number of bit(s) of the externally supplied address signal. Thus, with no need of applying a new command, the operating mode can be switched simply by switching the address signal, thereby allowing fast data reading. In addition, in an background operation, even if the same bank as the bank in progress of the internal operation is designated, data other than the status data can be read out according to the read mode designated.

The forcible activation of coincidence detecting signal MTH is implemented by a configuration of applying a signal obtained by taking the logical product of the coincidence detecting signal from coincidence detecting circuit 15 shown in FIG. 8 and the coincidence detecting signal from coincidence detecting circuit Ic shown in FIG. 3 to the internal control circuit as the coincidence detecting signal. At this time, non-coincidence detecting signal ZMTH from coincidence detecting circuit 15 is inactivated.

Second Embodiment

The non-volatile semiconductor memory device according to the second embodiment will be described with reference to FIG. 10. In the non-volatile semiconductor memory device (BGO flash memory) shown in FIG. 10, an external reading sense amplifier 20 for externally reading out selected memory cell data and a verifying sense amplifier for reading out the selected memory cell data at the time of verification of erase/program are provided separately from each other. More specifically, external reading sense amplifier 20 is provided commonly to banks B#1–B#4, and a write circuit and verifying sense amplifier block 22 is also provided commonly to banks B#1–B#4. Further, a write data buffer 21 for storing internal write data from data buffer 913 and an erase/program verify circuit 23 for performing erase/program verification under the control of internal control circuit 2 are both provided commonly to banks B#1–B#4.

Write circuit and verifying sense amplifier block 22 includes: a write circuit that generates internal write data (voltage) according to the write data stored in write data buffer 21 and transmits the data to an internal data line (bit line) of a selected bank; and a verifying sense amplifier that reads out the selected memory cell data at the time of erase/program verification. External reading sense amplifier 20 and write circuit and verifying sense amplifier block 22 are coupled to banks B#1–B#4 via respective separate paths. Thus, Y gate YGA has separate paths for coupling the internal data line (bit line) to external reading sense amplifier 20 and to write circuit and verifying sense amplifier block 22. As for the other components, the configuration of the BGO flash memory according to the present embodiment is identical to that of the BGO flash memory of the first embodiment shown in FIG. 1. Thus, corresponding portions are denoted by same reference characters, and detailed description thereof is not repeated.

Figure 10:
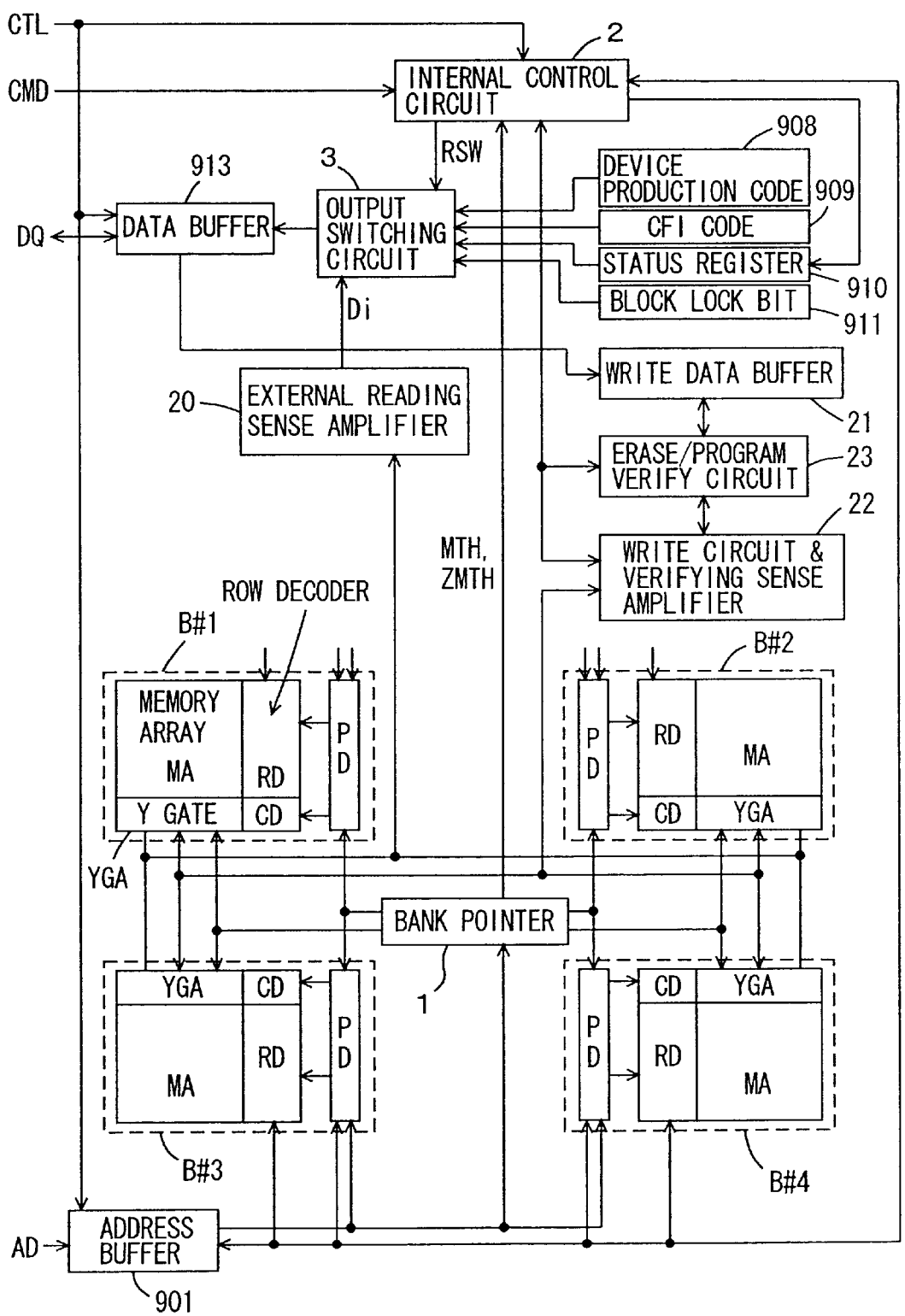
FIG. 10 schematically shows an entire configuration of a non-volatile semiconductor memory device according to a second embodiment of the present invention.
Figure 11:
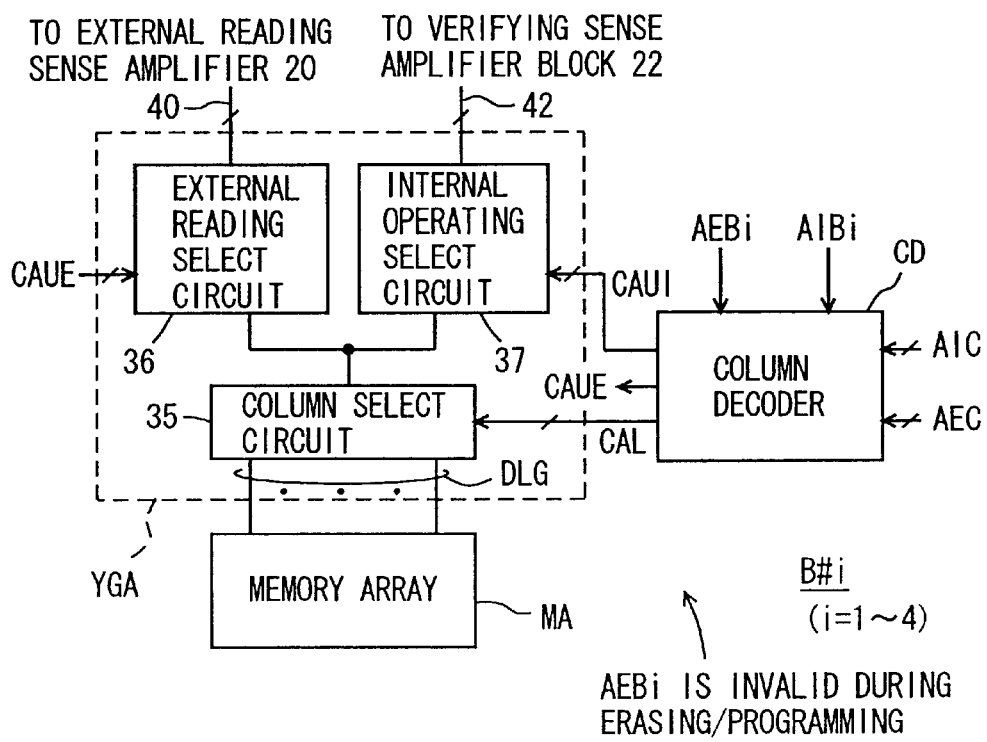
FIG. 11 schematically shows a configuration of a Y gate of a bank shown in FIG. 10.

Referring to FIG. 11 schematically showing a configuration of Y gate YGA shown in FIG. 10, Y gate YGA includes: a column select circuit 35 that selects a plurality of addressed columns from an internal data line group DLG of memory array MA according to column select signal CAL from column decoder CD; an external reading select circuit 36 that couples the columns selected by column select circuit 35 to an internal data transmission line 40 coupled to external reading sense amplifier 20 according to column select signal CAUE from column decoder CD; and an internal operating select circuit 37 that couples the columns selected by column select circuit 35 via an internal data transmission line 42 to verifying sense amplifier block 22 according to an internal operating path select signal CAUI. External reading select circuit 36 and internal operating select circuit 37 operate independently of each other. These select circuits 36 and 37 may be configured to further select a column in one block from the plurality of columns (one from each block) selected by column select circuit 35.

Column decoder CD decodes internal operating address signal (pre-decoded signal) AIC and external reading column address signal (pre-decoded signal) AEC according to bank designating signals AIBi and AEBi. When bank designating signal AEBi is at an active state, a column selecting operation is performed according to external reading column address signal (pre-decoded signal) AEC. When bank designating signal AIBi is at an active state, the column selecting operation is performed according to internal operating column address signal (pre-decode signal) AIC. These bank designating signals AEBi and AIBi are applied from bank pointer 1.

Figure 12:
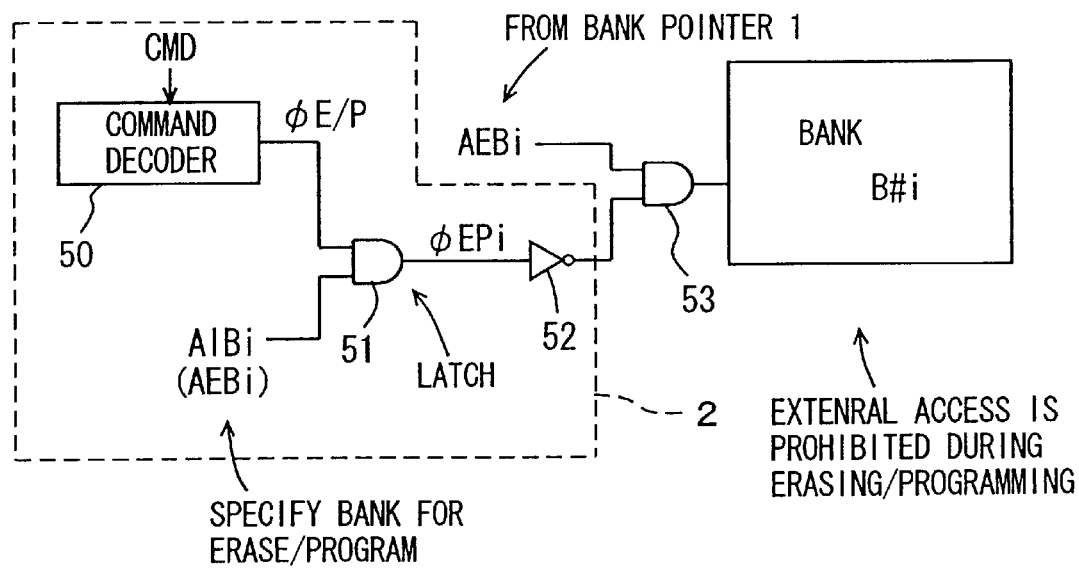
FIG. 12 schematically shows a configuration of a bank control unit of an internal control circuit shown in FIG. 10.

FIG. 12 shows an example of a configuration of internal control circuit 2 according to the second embodiment. Referring to FIG. 12, internal control circuit 2 includes: a command decoder 50 that decodes command CMD and activates an internal operation designating signal φE/P when the internal operation (erasing/programming) is designated; an AND circuit 51 that receives internal operation designating signal φE/P from command decoder 50 and internal bank designating signal AIBi (or AEBi); and an inverter circuit 52 that inverts an internal operation activating signal φEPi output from AND circuit 51.

Internal operation designating signal φE/P is activated when the erase/program mode is designated. Internal operation designating signal φEPi is activated according to the internal bank address signal AIBi (=AEBi) at the time of the command application. An output signal of an AND circuit 53 receiving bank designating signal AEBi from bank pointer 1 and the output signal of inverter 52 is applied to bank B#i. Thus, if bank B#i is designated by externally supplied address signal AD in progress of the internal operation, the operation to externally access the bank B#i is not performed. Bank B#i performs necessary operations for erasing/programming, under the control of internal control circuit 2. Thus, during the internal operation (erasing/programming operation) of bank B#i, external access to bank B#i is prohibited.

Provision of external reading sense amplifier 20 and verifying sense amplifier block 22 separately from each other, as shown in FIG. 10, can reduce the number of sense amplifiers, and hence, the chip occupying area. Further, by providing bank pointer 1 with capability of detecting coincidence/non-coincidence of bank addresses, it becomes possible to externally read out desired data from register circuits 908–911 while an internal, erasing/programming or verifying operation is being performed in a selected bank.

The configuration of other portions concerning switching of outputs in internal control circuit 2 is the same as that of the first embodiment. Accordingly, a BGO flash memory can be accomplished which allows reduction of the chip area and fast reading of necessary data, and, at the same time, offers a wider variety of options of read data in a background operation.

It should be noted that external reading sense amplifier 20 is activated when the array read mode is designated, whereas write circuit and verifying sense amplifier block 22 is activated when the erasing/programming operation is designated, under the control of internal control circuit 2.

Third Embodiment

The non-volatile semiconductor memory device according to the third embodiment will be described with reference to FIG. 13. The non-volatile semiconductor memory device shown in FIG. 13 does not have the BGO capability. Therefore, while one bank is being accessed, a busy signal (not shown) for prohibiting external access is set to an active state. The non-volatile semiconductor memory device shown in FIG. 13 includes banks B#1–B#4. Each of banks B#1–B#4 includes, as in the non-volatile semiconductor memory device having the BGO capability, memory array MA, pre-decoder PD, row decoder RD, column decoder CD, Y gate YG and sense amplifier SA.

Further, to perform writing, erase/program verify circuit 905 and write data buffer 904 are provided to banks B#1 and B#3, and erase/program verify circuit 907 and write data buffer 906 are provided to banks B#2 and B#4. In addition, register circuit 908 storing the ID code (device production code), register circuit 909 storing the CFI code, status data register circuit 910 storing the status data, and register circuit 911 storing the block lock bit are provided, as in the BGO flash memory.

Address buffer 60 takes in external address signal AD in response to activation of control signal CTL, and generates internal address signal ADI. Address buffer 60 receives an internal control address signal from internal control circuit 55, and at the time of an internal operation at a selected bank, generates the internal control address signal as internal address signal ADI. Thus, for performing only one operation of either an internal operation or an external reading operation, only internal address signal ADI is generated, and is supplied to banks B#1–B#4.

Activation/inactivation of these banks B#1–B#4 is performed under the control of internal control circuit 55. Internal control circuit 55 is supplied with coincidence detecting signal MTH and non-coincidence detecting signal ZMTH from bank pointer 65. Bank pointer 65 latches a prescribed bit of internal address signal ADI upon application of a read command, and detects coincidence/non-coincidence between the latched bit and a prescribed bit of internal address ADI generated according to externally supplied address signal AD. Upon activation of coincidence detecting signal MTH from bank pointer 65, internal control circuit 55 performs an operation according to the operating mode of which the content was set by the previous read command. Upon detection of non-coincidence, data of a selected memory cell in a designated bank is read out as default (no internal operation is performed).

Figure 13:
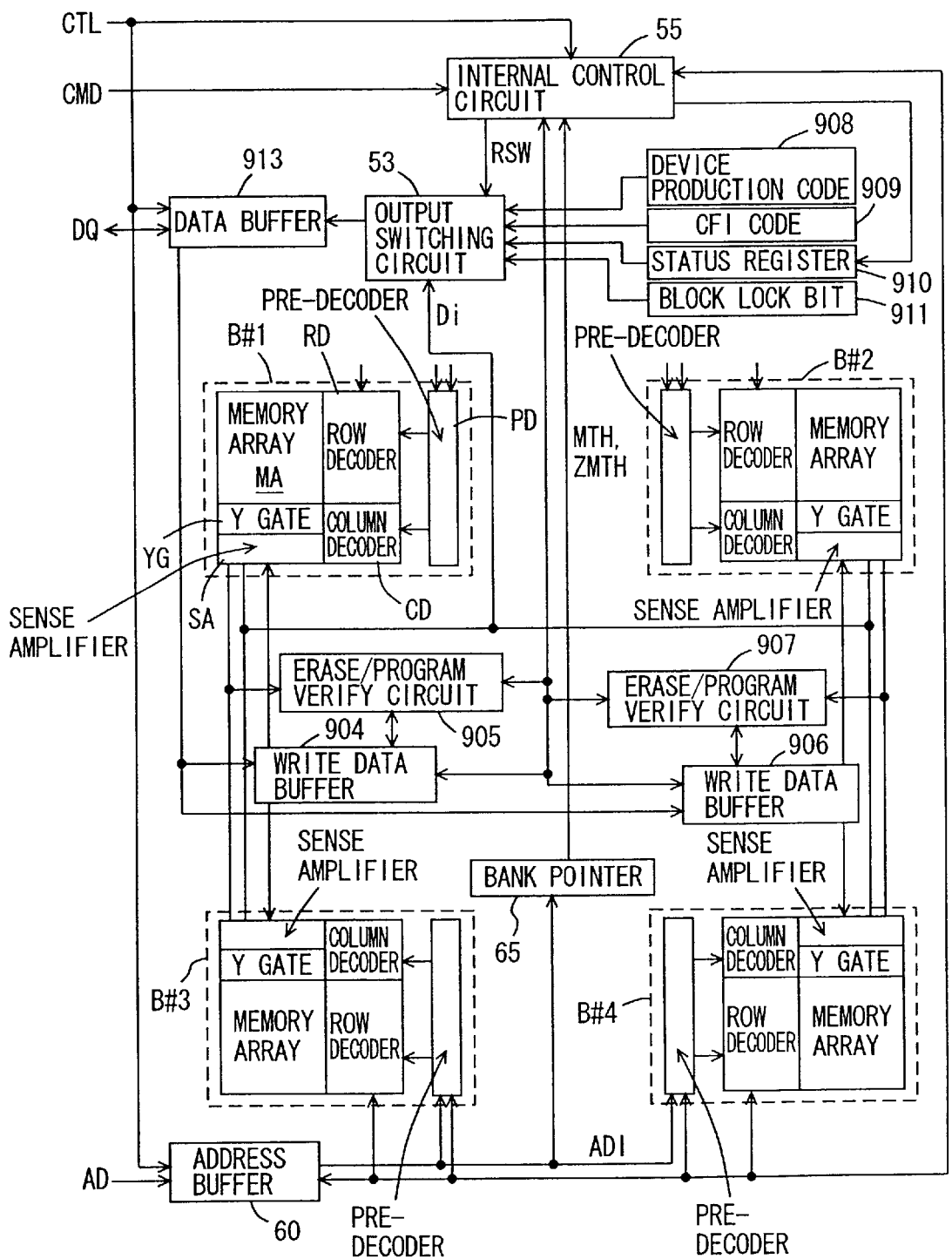
FIG. 13 schematically shows an entire configuration of a non-volatile semiconductor memory device according to a third embodiment of the present invention.
Figure 14:
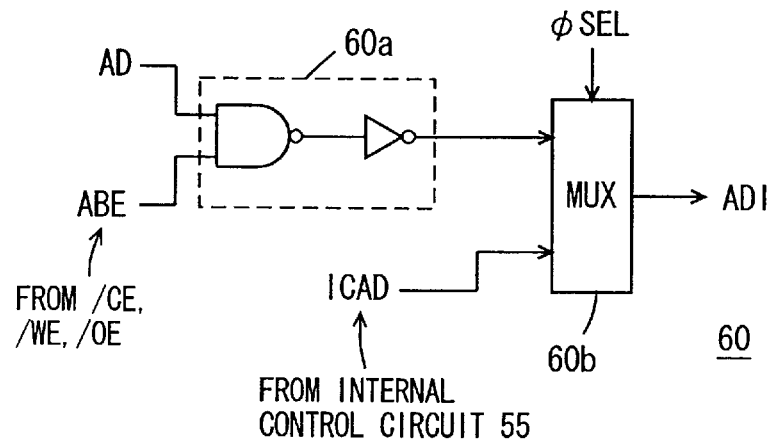
FIG. 14 schematically shows a configuration of an address buffer shown in FIG. 13.

FIG. 14 schematically shows a configuration of address buffer 60 shown in FIG. 13. In FIG. 14, address buffer 60 includes: an AND type buffer circuit 60a that receives external address signal AD and an address buffer activating signal ABE; and a multiplexer (MUX) 60b that selects either one of the output signal of AND type buffer circuit 60a and internal control address signal ICAD from internal control circuit 55 according to a select signal φSEL, and generates internal address signal ADI.

When an internal operation is to be performed, multiplexer MUX selects internal control address signal ICAD according to select signal φSEL. When a command is externally supplied and when the internal operation is not performed, multiplexer (MUX) 60b selects the output signal of AND type buffer circuit 60a. Thus, address buffer 60 normally implements one operating mode. More specifically, either an internal erasing/programming operation or an array/register reading operation is performed in one cycle. Address buffer activating signal ABE is activated according to chip enable signal /CE, write enable signal /WE and output enable signal /OE.

Figure 15:
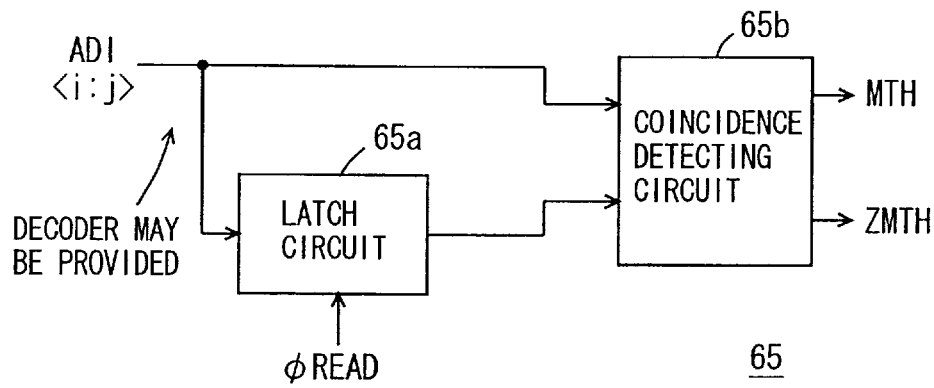
FIG. 15 schematically shows a configuration of a bank pointer shown in FIG. 13.

FIG. 15 schematically shows a configuration of bank pointer 65 shown in FIG. 13. In FIG. 15, bank pointer 65 includes: a latch circuit 65a that latches prescribed bits ADI<i:j> of internal address signal ADI from address buffer 60 according to a read command application detecting signal φREAD; and a coincidence detecting circuit 65b that detects coincidence/non-coincidence of the latched bits at latch circuit 65a and address signal bits ADI<i:j>, and activates one of coincidence detecting signal MTH and non-coincidence detecting signal ZMTH accordance with the result of detection. Address signal bits ADI<i:j> may be a bank address. Read command application detecting signal φREAD is activated when a register read command or an array read command is externally supplied as a command. Thus, at the time of application of such command, the bits latched at latch circuit 65a are updated.

Coincidence detecting circuit 65b detects coincidence/non-coincidence of the latched bits at latch circuit 65a and address signal bits ADI<i:j> and, according to the detected result, activates one of coincidence detecting signal MTH and non-coincidence detecting signal ZMTH. Coincidence detecting circuit 65b performs the bit-to-bit comparison operation. Alternatively, in the case where the address signal bits ADI<i:j> are the bank address, a decoder may be provided which decodes the internal address signal bits ADI<i:j> to generate a bank designating signal, which in turn is latched at latch circuit 65a and also provided to coincidence detecting circuit 65b, where coincidence/non-coincidence of the bank designating signal at an active state is detected. For the detection of coincidence/non-coincidence of the bit values, a subtraction circuit may be used, or alternatively, a coincidence detecting circuit (EXNOR circuit) may be provided for each bit, and according to the logical product of the output signals of these coincidence detecting circuits, coincidence detecting signal MTH may be generated.

Figure 16:
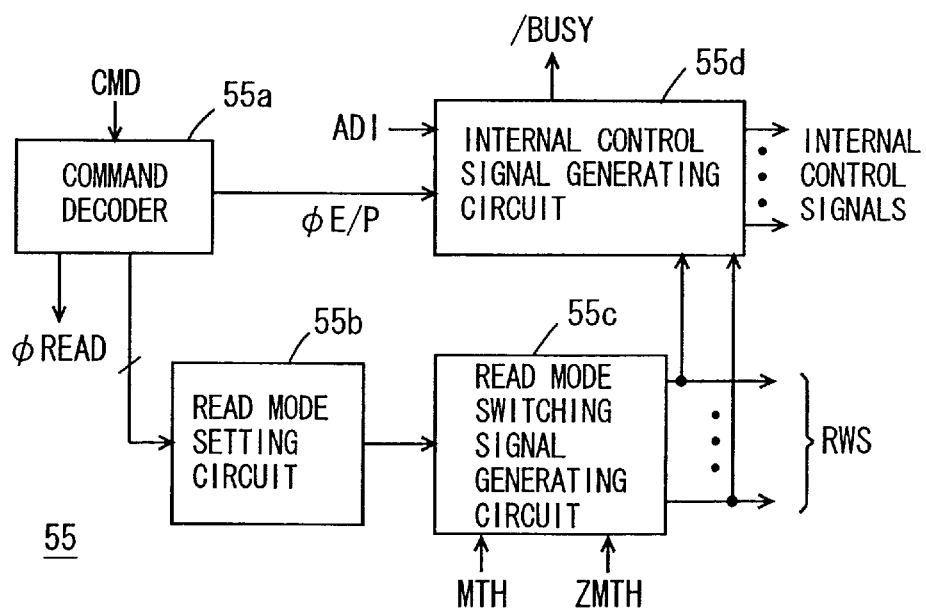
FIG. 16 schematically shows a configuration of an internal control circuit shown in FIG. 13.

FIG. 16 schematically shows a configuration of internal control circuit 55. In FIG. 16, internal control circuit 55 includes: a command decoder 55a that decodes command CMD and generates read command application detecting signal φREAD and a read mode specifying signal as well as erase/program designating signal φE/P; a read mode setting circuit 55b that sets the read mode according to the read mode specifying signal from command decoder 55a; a read mode switching signal generating circuit 55c that generates a read mode switching signal RWS according to the read mode set by read mode setting circuit 55b and coincidence detecting signal MTH and non-coincidence detecting signal ZMTH; and an internal control signal generating circuit 55d that generates necessary internal control signals according to read mode switching signal RWS from read mode switching signal generating circuit 55c and erase/program designating signal φE/P from command decoder 55a. Internal control signal generating circuit 55d is further supplied with internal address signal ADI.

When a read command is applied, read command application detecting signal φREAD is activated. Read mode setting circuit 55b takes in the read mode specifying signal from command decoder 55a, and generates a read mode setting signal. Upon activation of coincidence detecting signal MTH, read mode switching signal generating circuit 55c generates read mode switching signal RWS according to the read mode set at read mode setting circuit 55b. Upon activation of non-coincidence detecting signal ZMTH, read mode switching signal generating circuit 55c activates an array read mode (a memory cell data read signal ARR).

When erase/program designating signal φE/P is applied, internal control signal generating circuit 55d performs the erasing/programming operation on a bank designated according to address signal ADI. Upon application of a read command, internal control signal generating circuit 55d generates internal control signals for realizing a necessary read mode according to read mode switching signal RWS. For example, when a register read mode is designated for reading out data from the status data register, internal control signal generating circuit 55d generates status data for the specified bank, and stores the data in the status data register circuit. When the array read mode is designated, internal control signal generating circuit 55d generates a control signal for performing reading of memory cell data in a selected bank according to the address signal ADI. Upon the application of erase/program designating signal φE/P, internal control signal generating circuit 55d further generates and externally outputs a busy signal /BUSY to prohibit external access.

Read mode setting circuit 55b is formed of a latch circuit that latches an operating mode specifying signal from the command decoder upon activation of read command application detecting signal φREAD. Read mode switching signal generating circuit 55c is formed of AND circuits 2h–2k and composite gate circuit 21 in the read mode switching signal generating circuit shown in FIG. 5. These read mode setting circuit 55b and read mode switching signal generating circuit 55c may have configurations as in the first embodiment.

In the third embodiment as well, an operating mode may be specified by an address signal of an arbitrary number of bits, in place of a bank address signal.

As described above, according to the third embodiment, a flash memory without the BGO capability is furnished with a bank pointer having a function of detecting coincidence/non-coincidence of specific address signal bits, and an operating mode to be performed in a read mode is specified by coincidence/non-coincidence detecting signals from the bank pointer. Accordingly, it is unnecessary to apply any command to specify the content of read mode, and reading of necessary data can be performed by simply switching the address.

Fourth Embodiment

Figure 17:
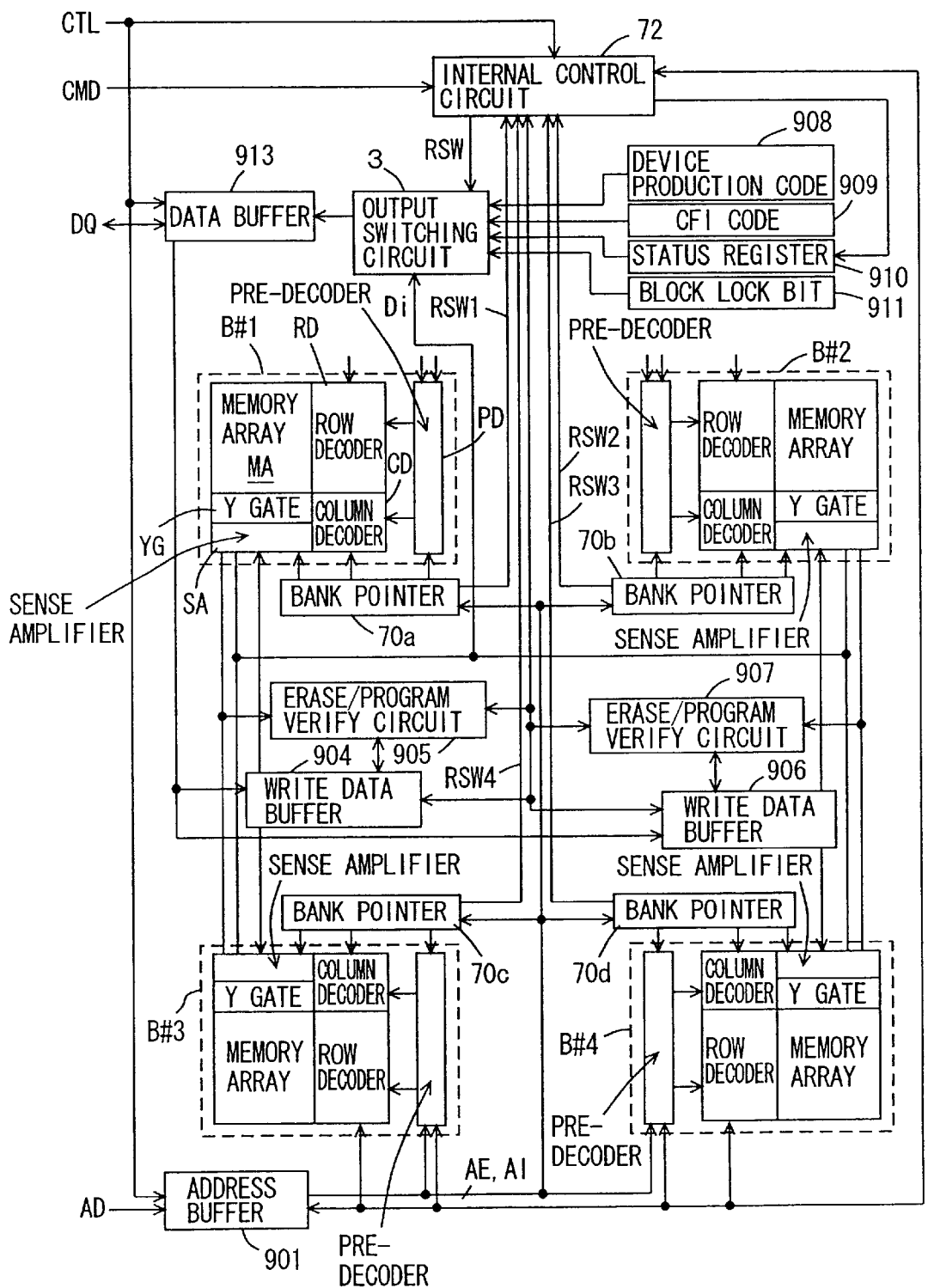
FIG. 17 schematically shows an entire configuration of a non-volatile semiconductor memory device according to a fourth embodiment of the present invention.

The non-volatile semiconductor memory device according to the fourth embodiment will be described with reference to FIG. 17. The non-volatile semiconductor memory device shown in FIG. 17 is a BGO flash memory. Thus, address buffer 901 generates both external reading address signal AE and internal operating address signal AI. Specific bits (bank address) of address signals AE and AI from address buffer 901 are supplied to bank pointers 70a–70d provided corresponding to banks B#1–B#4, respectively. Bank pointers 70a–70d store read mode specifying data independently of each other, and upon designation of the associated banks, supply read mode switching signals RSW1–RSW4 to internal control circuit 72. According to the read mode switching signals RSW1–RSW4 supplied from bank pointers 70a–70d, internal control circuit 72 generates read mode switching signal RSW for application to output switching circuit 3.

Thus, in the BGO flash memory shown in FIG. 17, the content of read mode can be specified on the bank basis, and various kinds of read modes can be specified simply by changing the bank address signals. Accordingly, even when the internal operation is being performed on one hand, it is possible to realize a read mode other than the array read or the status register read on the other hand, by switching the bank address.

Figure 18:
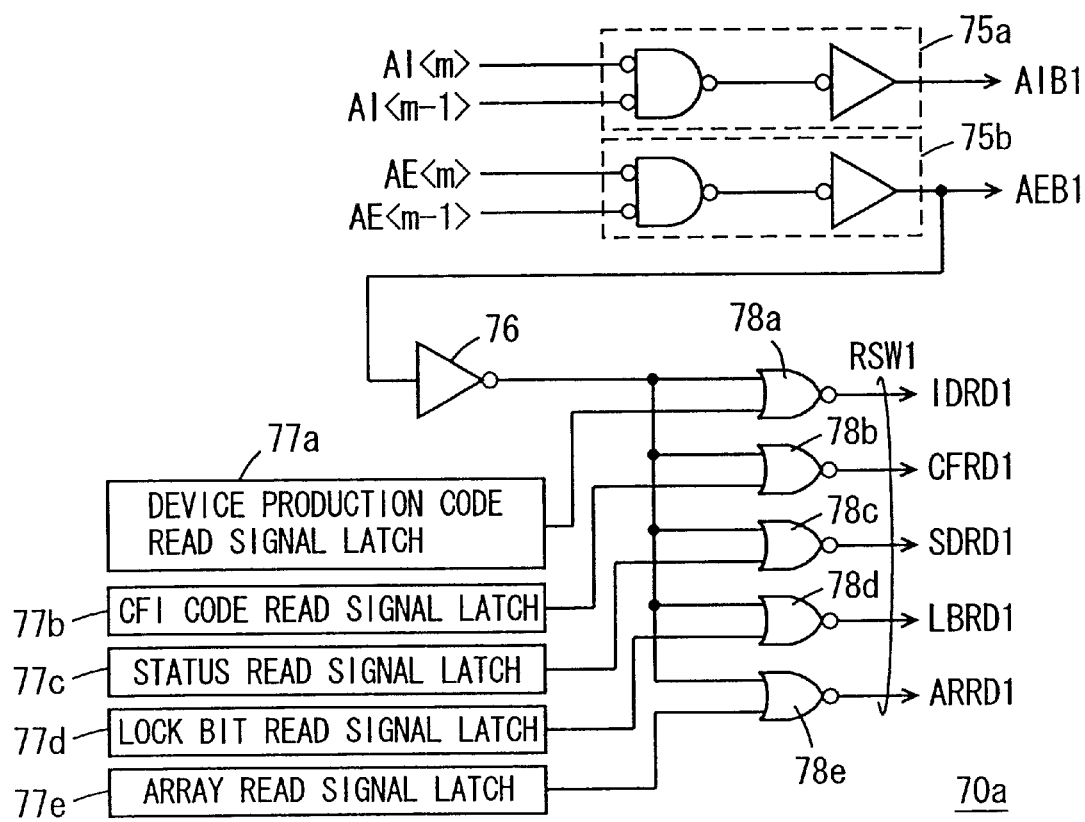
FIG. 18 schematically shows a configuration of a bank pointer shown in FIG. 17.

FIG. 18 schematically shows a configuration of bank pointer 70a provided to bank B#1. Bank pointers 70a–70d each have an identical configuration, except that a combination of address signal bits upon generation of a bank designating signal is different from each other.

Referring to FIG. 18, bank pointer 70a includes: an AND type decode circuit 75a that receives internal control address signal bits AI<m> and AI<m-1> and generates an internal operating bank designating signal AIB1; and an AND type decode circuit 75b that receives external operating address signal bits AE<m> and AE<m-1> and generates an external operating bank designating signal AEB1. When address signal bits AI<m> and AI<m-1> are both at an L level, AND type decide circuit 75a drives bank designating signal AIB1 to a selected state of an H level. When address signal bits AE<m> and AE<m-1> are both at an L level, AND type decode circuit 75b drives bank designating signal AEB1 to a selected state. These address signal bits AI<m> and AI<m-1> constitute the bank address for the internal operation, and address signal bits AE<m> and AE<m-1> constitute the bank address for the external operation.

Bank pointer 70a further includes: an inverter 76 that inverts bank designating signal AEB1; a latch circuit 77a that latches a device production code read signal for reading out the device production code (ID code); a CFI code read signal latch circuit 77b that latches a CFI code read signal; a latch circuit 77c that latches a status data read signal; a latch circuit 77d that latches a lock bit read signal; a latch circuit 77e that latches an array read signal; a NOR circuit 78a that receives the latched signal at latch circuit 77a and the output signal of inverter 76 and generates an ID code reading designating signal IDRD1; a NOR circuit 78b that receives the output signal of inverter 76 and the output signal of latch circuit 77b and generates a CFI code reading designating signal CFR1; a NOR circuit 78c that receives the output signal of inverter 76 and the output signal of latch circuit 77c and generates a status data reading designating signal SDRD1; a NOR circuit 78d that receives the output latch signal of latch circuit 77d and the output signal of inverter 76 and generates a lock bit reading designating signal LBRD1; and a NOR circuit 78e that receives the output signal of inverter 76 and the latched signal at latch circuit 77e and generates an array data reading designating signal ARRD1.

When the output signal of inverter 76 is at an H level, NOR circuits 78a–78e set respective data reading designating signals IDRD1, CFRD1, SDRD1, LBRD1 and ARRD1 to an L level. In other words, when the associated bank B#1 is not designated by the external address signal, these reading designating signals are maintained at an inactive state. When bank designating signal AEB1 attains an H level, the output signal of inverter 76 attains an L level. NOR circuits 78a–78e each operate as an inverter, and according to the signals latched at latch circuits 77a–77e, read mode switching signal RSW1 is generated to specify the content of external read mode that is to be performed for the bank B#1. This read mode switching signal RSW1 is supplied to internal control circuit 72 shown in FIG. 17. According to read mode switching signal RSW1 supplied, internal control circuit 72 performs control of internal operation, and also supplies read mode switching signal RSW to output switching circuit 3 to set the circuit 3 to the state corresponding to the designated operating mode.

Figure 19:
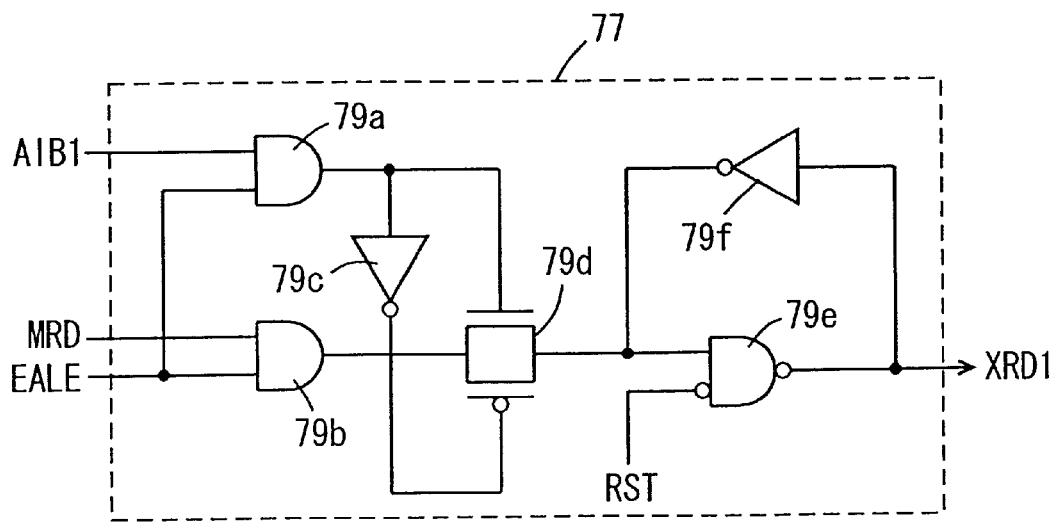
FIG. 19 shows an example of a configuration of a latch circuit shown in FIG. 18.

Latch circuits 77a–77e shown in FIG. 18 each have an identical configuration, and thus, the configuration of one latch circuit 77 is representatively shown in FIG. 19. Referring to FIG. 19, latch circuit 77 includes: an AND circuit 79a that receives internal operating bank designating signal AIB1 and external address latch enable signal EALE; an AND circuit 79b that receives read mode specifying signal MRD from the command decoder and external address latch enable signal EALE; an inverter 79c that inverts the output signal of AND circuit 79a; a transmission gate 79d that passes the output signal of AND circuit 79b according to the output signals of inverter 79c and AND circuit 79a; and a gate circuit 79e and an inverter 79f that latch the signal applied via transmission gate 79d.

Gate circuit 79e receives the signal applied via transmission gate 79g at its first input and reset signal RST at its second input, and outputs read mode specifying signal XRD1 (IDRD1 etc.). Inverter 79f inverts the output signal of gate circuit 79e and supplies the inverted signal to the first input of gate circuit 79e. Gate circuit 79e operates as an inverter circuit when reset signal RST is at an L level, and thus, gate circuits 79e and 79f form an inverter latch. On the contrary, when reset signal RST attains an H level, gate circuit 79e resets read mode specifying signal XRD1 to an inactive state at an H level. In operation, NOR circuits 78a–78e each operate as an inverter, and therefore, these latch circuits 77(77a–77e) latches respective reading designating signals in read mode switching signal RSW1 with their logical levels being inverted.

When a command is externally supplied, external address latch enable signal EALE is activated, and AND circuits 79a and 79b are enabled. If bank B#1 is specified when such external command is supplied, bank designating signal AIB1 is driven to an active state according to external address signal AD (see FIG. 27). Thus, transmission gate 79d is rendered conductive, and causes read mode specifying signal MRD supplied via AND circuit 79b to pass therethrough to be latched by gate circuits 79e and 79f. In other words, the latch signal of latch circuit 77 is set according to read mode specifying signal MRD supplied from the command decoder or the read mode setting circuit.

Upon command application, if a bank other than bank B#1 is designated, bank designating signal AIB1 maintains the inactive state of an L level. Thus, transmission gate 79d maintains the non-conductive state, and therefore, read mode specifying signal XRD1 being latched does not change its state.

When the external bank address is simply changed, the content latched at latch circuit 77 does not change. NOR circuits 78a–78e simply generate read mode switching signal RSW1 according to the latched read mode specifying signals. Thus, it becomes possible to specify an operating mode to be executed on the bank basis.

Figure 20:
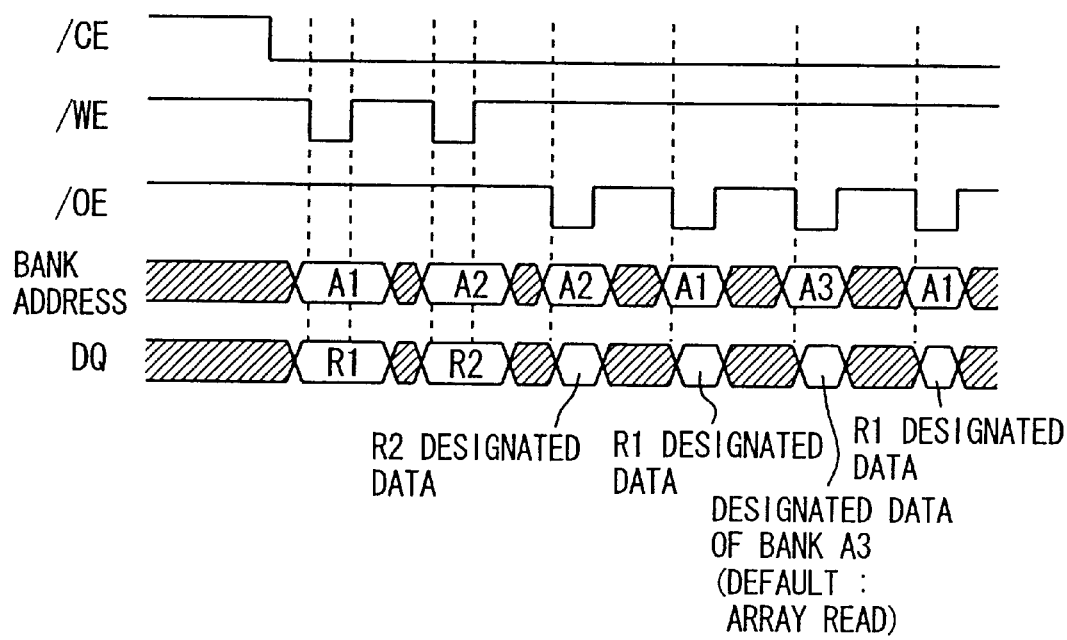
FIG. 20 is a timing chart illustrating an operation of the non-volatile semiconductor memory device shown in FIG. 17.

An operation sequence of the fourth embodiment will be described with reference to FIG. 20 shown by way of example. Referring to FIG. 20, bank address A1 is first set. Read mode specifying command R1 is then applied as a command. Thus, at a bank designated by bank address A1, a read mode designated by read mode specifying command R1 is set.

Thereafter, bank address A2 as well as command R2 are supplied, to set the content of read mode for the bank designated by bank address A2.

Data reading is then requested for the bank designated by bank address A2 (by activating signals /CE and /OE). In this case, data designated by command R2 is read out from the bank specified by bank address A2.

Thereafter, data reading is requested for bank address A1. Thus, data designated by read command R1 is read out from the bank designated by bank address A1.

When data reading is performed with designation of bank address A3, data, according to the content of the read mode designated in the previous cycle, is read out from this bank A3. It is also possible to configure that the array read mode is set at bank A3 as a default value. In this case, the array read (reading of selected memory cell data) can be performed with no need of specifying the read mode using a specific command.

When data reading is performed with designation of bank address A1 again, the data of the content designated by read command R1 is read out from the bank specified by bank address A1.

Thus, the reading content can be changed for each bank. For example, by applying bank addresses specifying banks B#2–B#4 while an internal, erasing/programming operation is being performed in bank B#1, it becomes possible to read out memory cell data from banks B#2–B#4 or to read out data from register circuits 908–911. In particular, by changing the content of read mode for each bank, it becomes possible to read out the contents of multiple register circuits simply by sequentially changing the bank addresses.

Figure 21:
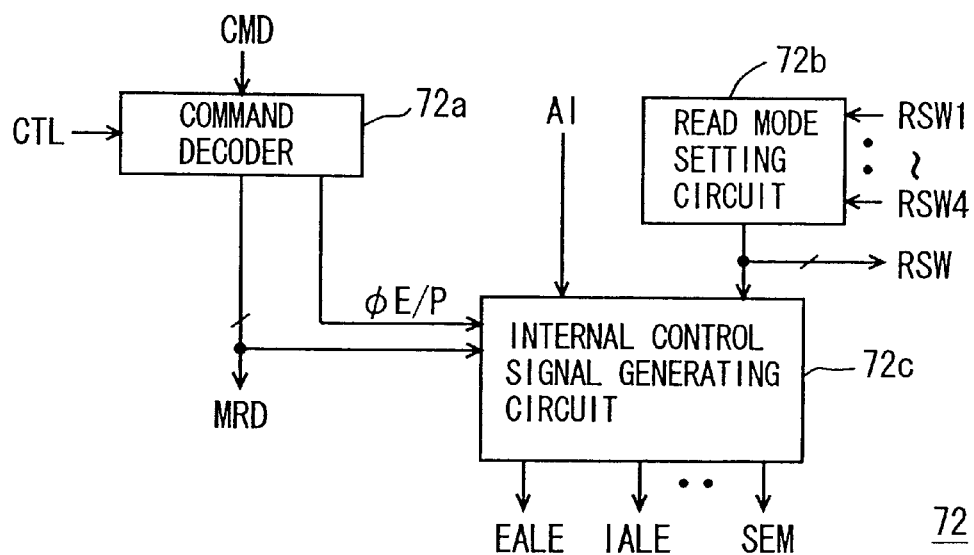
FIG. 21 schematically shows a configuration of an internal control circuit shown in FIG. 17.

FIG. 21 schematically shows a configuration of internal control circuit 72 shown in FIG. 17. Referring to FIG. 21, internal control circuit 72 includes: a command decoder 72a that takes in and decodes external command CMD according to control signal CTL; a read mode setting circuit 72b that receives read mode switching signals RSW1–RSW4 from bank pointers 70a–70d of the respective banks and generates read mode switching signal RSW; and an internal control signal generating circuit 72c that receives read mode switching signal RWS from read mode setting circuit 72b, operating mode designating signal φE/P and MRD from command decoder 72a, and internal control address signal AI, and generates various necessary internal control signals.

Read mode setting circuit 72b generates read mode switching signal RSW to be applied to output switching circuit 3, according to the logical sums of respective read mode switching signals RSW1–RSW4 from bank pointers 70a–70d and each read mode designating signal.

Internal control signal generating circuit 72c generates internal control signals necessary for a designated operating mode, and also updates internal control address signal AI. In FIG. 21, external address latch enable signal EALE, internal control address latch enable signal IALE, and a main sense amplifier activating signal SEM are shown as representatives of the internal control signals. Main sense amplifier activating signal SEM from internal control signal generating circuit 72c is commonly supplied to banks B#1–B#4, and in turn, each bank generates a sense amplifier activating signal for its corresponding sense amplifier according to the bank specifying signal from the bank pointer. The same applies to the other internal operations such as verifying operation.

For a bank performing an internal operation like erasing/programming operation, the read mode of the bank is set, e.g., to a status data read mode in the preceding cycle. This prevents an array read mode from being conducted for the bank performing the internal, e.g., erasing/programming operation.

Modification

Figure 22:
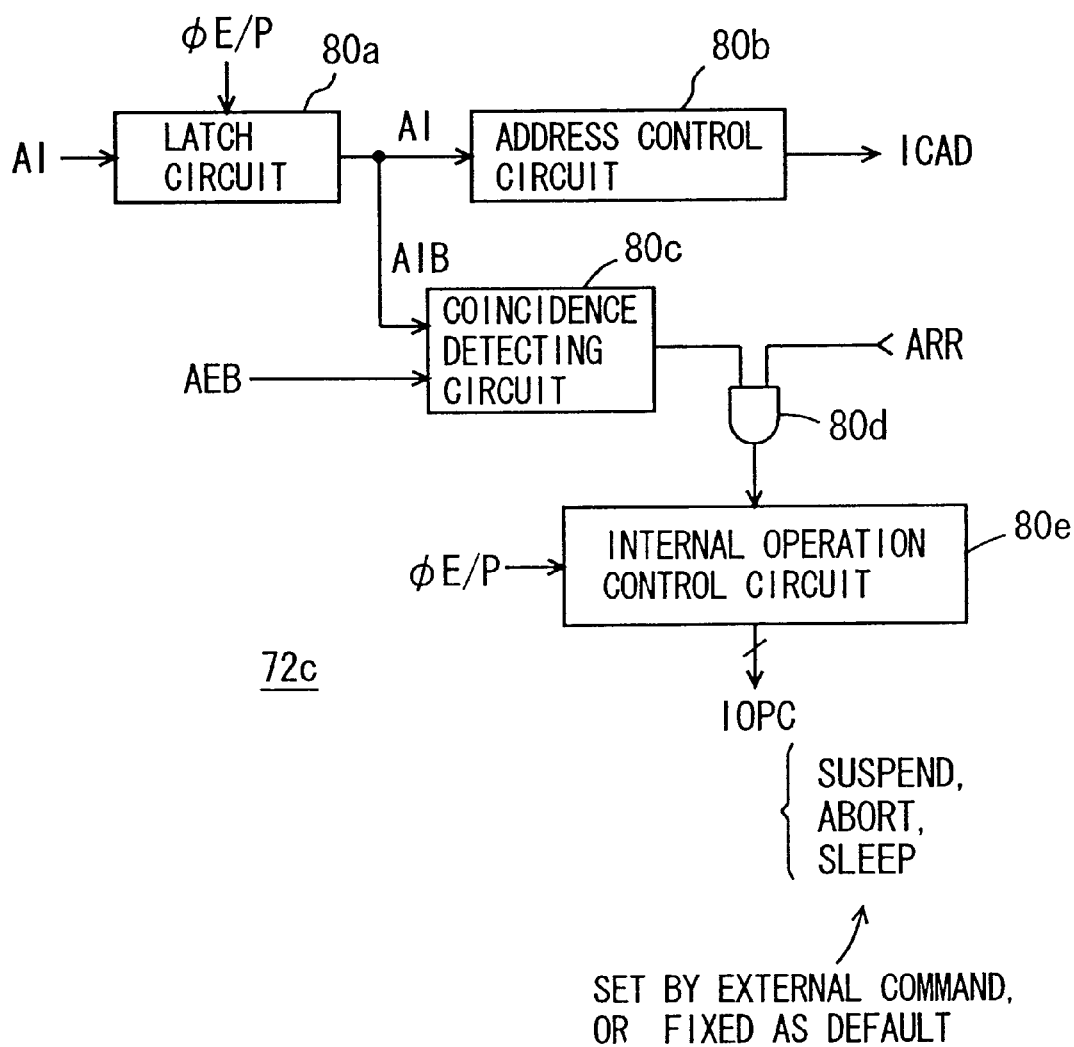
FIG. 22 schematically shows a configuration of a modification of the internal control circuit shown in FIG. 17.

FIG. 22 shows a modification of the internal control signal generating circuit 72c shown in FIG. 21. Referring to FIG. 22, internal control signal generating circuit 72c includes: a latch circuit 80a that latches internal control address signal AI upon activation of erase/program designating signal φE/P; a coincidence detecting circuit 80c that detects coincidence/non-coincidence between bank address signal (bank designating signal) AIB of the latched address signal from latch circuit 80a and bank address signal (bank designating signal) AEB of an externally supplied address signal; an address control circuit 80b that changes the address signal latched at latch circuit 80a according to a prescribed sequence to generate internal control address signal ICAD; an AND circuit 80d that receives the output signal of coincidence detecting circuit 80c and array read mode designating signal ARR; and an internal operation control circuit 80e that generates an internal operation control signal IOPC necessary for the internal operation according to the output signal of AND circuit 80d and erase/program operation designating signal φE/P.

In the internal control signal generating circuit 72c shown in FIG. 22, when an array read mode is designated, according to the external address, for the bank subject to the internal operation such as erasing/programming operation, the output signal of AND circuit 80d attains an active state of an H level. In this case, internal operation control circuit 80e for control of erasing/programming operation performs a predetermined operation. More specifically, it temporarily interrupts the erasing/programming operation and reads out data of a selected memory cell from the associated bank according to the externally supplied array read mode (SUSPEND). Alternatively, it ignores the activation of array read mode designating signal ARR and continues the internal, erasing/programming operation (ABORT), or it sets the corresponding bank to an operation halt condition (SLEEP).

Thus, in this case, it is unnecessary to set an operating mode other than the array read mode for a bank undergoing an internal operation prior to the execution of the internal operation. Rather, the internal operation is performed according to the operation sequence that is set by internal operation control circuit 80e in advance.

It is noted that another command may be used for setting the contents of operations to be performed by internal operation control circuit 80e.

As described above, according to the fourth embodiment of the present invention, a bank pointer is provided for each bank, and the content of read mode is set on the bank pointer basis. Thus, the read mode can be switched by simply switching the bank address. Further, even when the internal operation is being performed, it is possible to read out desired data by switching the bank address.

Fifth Embodiment

Figure 23:
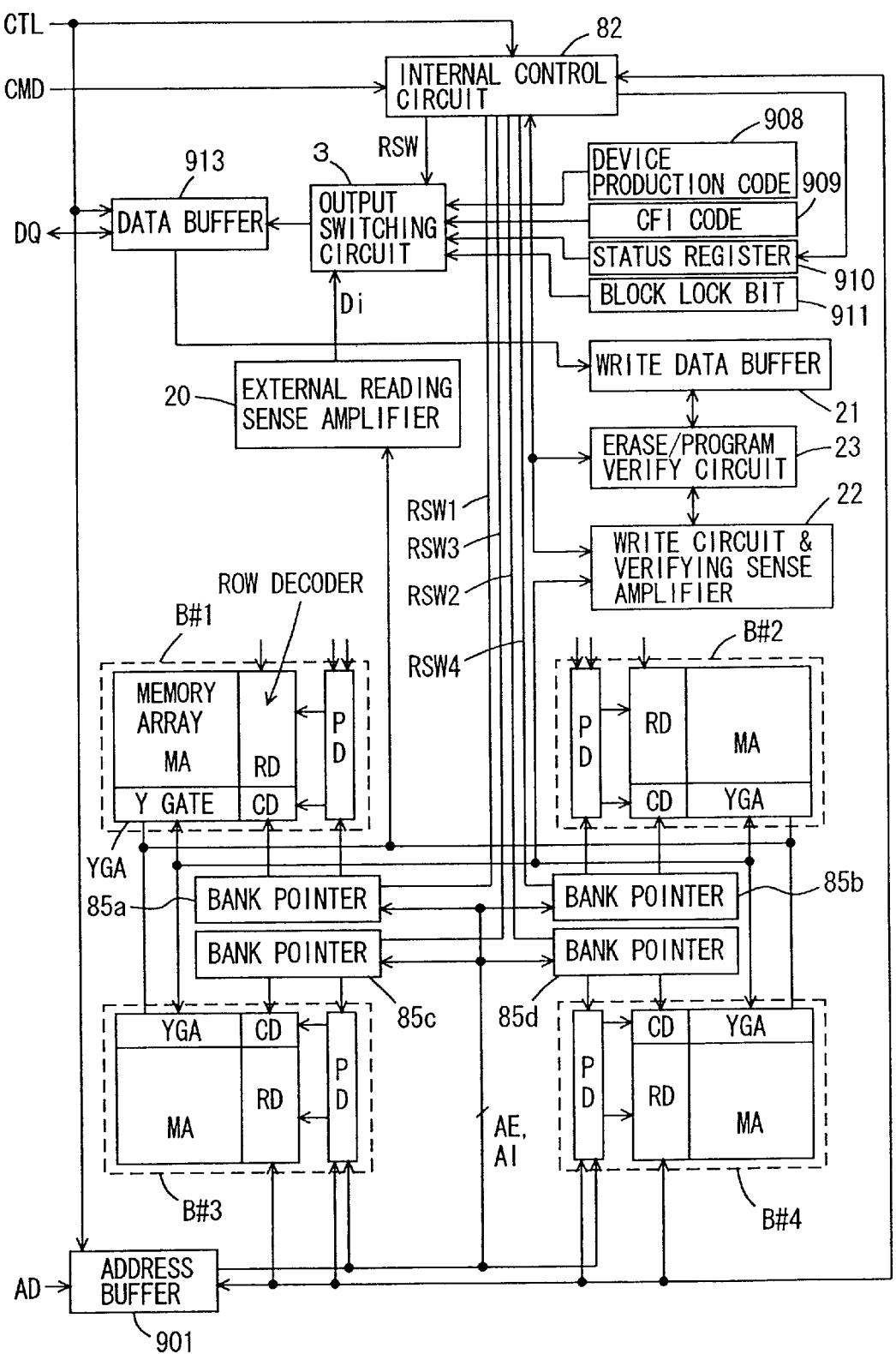
FIG. 23 schematically shows an entire configuration of a non-volatile semiconductor memory device according to a fifth embodiment of the present invention.

The non-volatile semiconductor memory device according to the fifth embodiment will be described with reference to FIG. 23. The non-volatile semiconductor memory device shown in FIG. 23 is a BGO flash memory, and includes an external reading sense amplifier 20 commonly provided to banks B#1–B#4. A write data buffer 21, a write circuit and verifying sense amplifier block 22, and an erase/program verify circuit 23 are also provided commonly to banks B#1–B#4.

The BGO flash memory shown in FIG. 23 reduces the area occupied by sense amplifier, as is the case for the BGO flash memory shown in FIG. 10. Bank pointers 85a–85d are provided to respective banks B#1–B#4. Each of bank pointers 85a–85d has a configuration identical to the bank pointer according to the fourth embodiment shown in FIG. 18, and latches a read mode specifying signal, and generates, when the corresponding bank is designated, a reading operation specifying signal stored therein for application to internal control circuit 82. Internal control circuit 82 controls the internal reading operation according to read mode switching signals RSW1–RSW4 from bank pointers 85a–85d, and also generates read mode switching signal RSW for application to output switching circuit 3.

The operations of bank pointers 85a–85d and internal control circuit 82 are the same as those of bank pointers 70a–70d and internal control circuit 82 according to the fourth embodiment.

Thus, even with the configuration where external reading sense amplifier 20 is commonly provided to banks B#1–B#4, it is possible to set the read mode content on the bank basis, and the read mode can be switched by simply switching the bank address.

In the fourth and fifth embodiments as well, the number of banks is not limited to four. In addition, a prescribed number of bits of address signals AE and AI may be used instead of the bank address signal. Specification and switching of the read mode can be performed in a predetermined address region basis in this case.

As described above, according to the fifth embodiment of the present invention, a sense amplifier for external reading is provided commonly to a plurality of banks, and a sense amplifier for internal operation (for verifying operation) is provided separately from the external reading sense amplifier. Thus, the chip occupying area can be reduced without damaging the BGO function (capability). In addition, bank pointers are provided for the respective banks and each bank pointer stores therein a read mode specifying signal. Thus, the content of read mode can be set on the bank basis, an increased number of kinds of data can be read out during the BGO operation, thereby improving the usability of the memory device. Furthermore, simple switching of address signal bits allows switching of the read modes. Thus, necessary data can be read out at high speed.

Sixth Embodiment

The non-volatile semiconductor memory device according to the sixth embodiment will be described with reference to FIG. 24. The non-volatile semiconductor memory device shown in FIG. 24 does not have the BGO capability. Thus, address buffer 60 generates only internal address signal ADI. Bank pointers 92a–92d are provided corresponding to banks B#1–B#4, respectively. These bank pointers 92a–92d store information specifying respective read modes, like bank pointers 70a–70d of the fourth embodiment, and supply read mode specifying signals RSW1–RSW4 stored therein to internal control circuit 90 when internal address signal ADI from address buffer 60 designates the corresponding banks. Internal control circuit 90 generates read mode switching signal RSW for application to output switching circuit 53 according to read mode specifying signals RSW1–RSW4 from bank pointers 92a–92d, and also performs the designated operating mode. As for the other components, the configuration of the semiconductor memory device of the present embodiment is identical to that shown in FIG. 13. Thus, corresponding portions are denoted by same reference characters, and detailed description thereof is not repeated.

Bank pointers 92a–92d each have a configuration identical to the bank pointer shown in FIG. 18. When a command designating a read mode is externally supplied, the designated mode is set to a designated bank. Thus, although the BGO operation is not available, it is unnecessary to apply a command and then designate the reading operation. By simply changing the bank address, necessary data can be read out at high speed.

Figure 24:
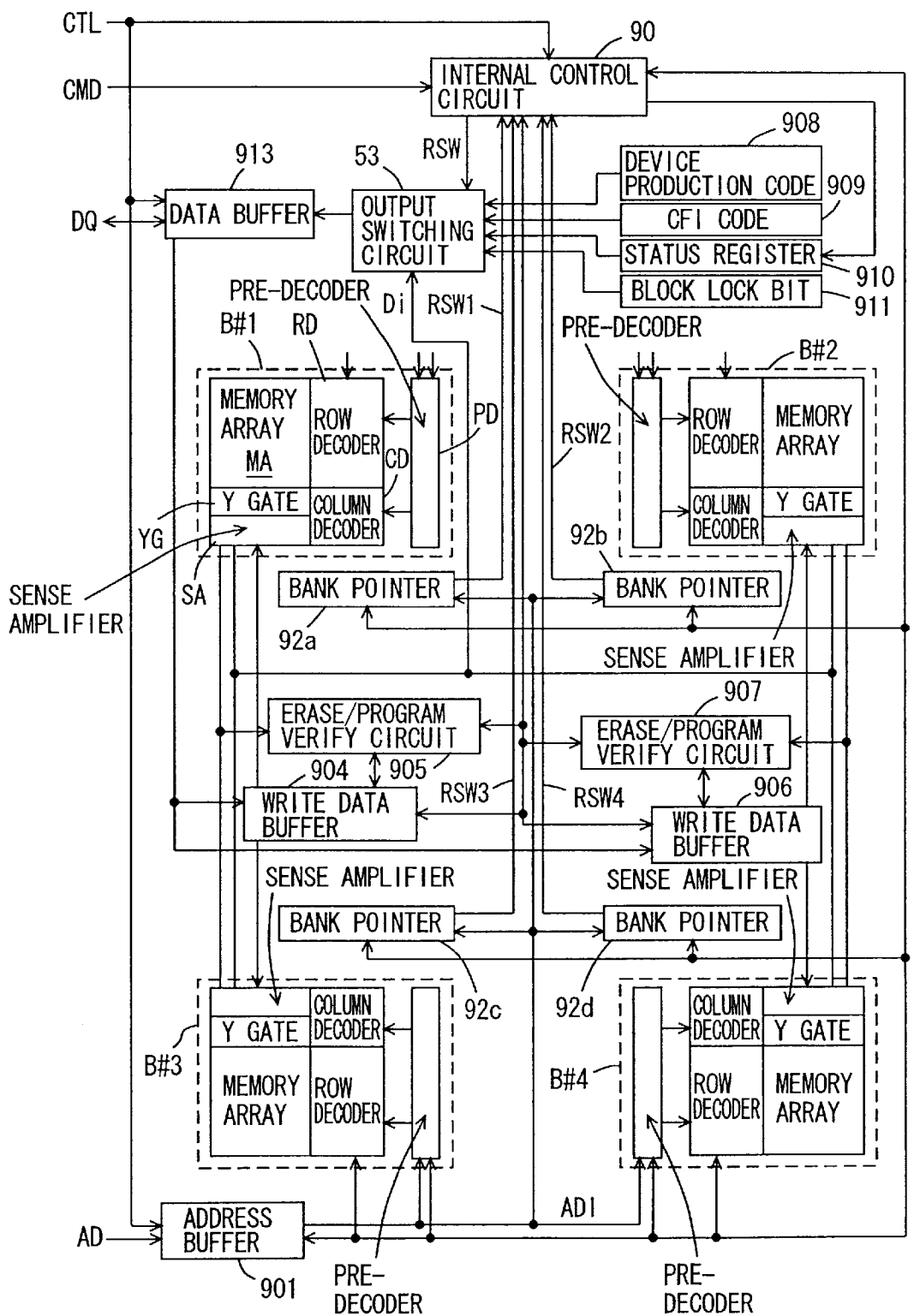
FIG. 24 schematically shows an entire configuration of a non-volatile semiconductor memory device according to a sixth embodiment of the present invention.

In the configuration shown in FIG. 24, read mode specifying signals RSW1–RSW4 are generated from bank pointers 92a–92d and supplied to internal control circuit 90. Internal control circuit 90 performs the operation control for a designated bank according to the bank address. In this case, however, such a configuration may be employed that internal control circuit 90 generates a main control signal according to the designated operating mode, and at respective banks B#1–B#4, local control signals are generated according to the bank designating signals from corresponding bank pointers 92a–92d, to perform the designated operation in the selected bank.

As described above, according to the sixth embodiment of the present invention, even in the non-volatile semiconductor memory device without the BGO capability, bank pointers storing information specifying the operating modes are provided corresponding to a plurality of banks, and the internal operation is performed according to the operating mode designating signal from a corresponding bank pointer with the bank address signal switched.

Accordingly, the content of read mode can be switched by simply switching the bank address, thereby allowing rapid reading of necessary data.

In the sixth embodiment as well, bank pointers 92a–92d do not normally need to store the information specifying the operating modes according to the bank address. Instead, the operating mode information may be set at respective pointers 92a–92d according to specific address signal bits. In addition, the number of banks may be more than four, or may be two.

As explained above, according to the present invention, the content of read mode can be changed simply by changing a prescribed bit of an address signal of a bank or the like, with no need of applying any command. This allows high speed reading of necessary data. Further, an increased number of kinds of read modes can be performed during the background operation, so that usability of the semiconductor memory device improves.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device capable of operating in a plurality of operating modes, comprising:

a plurality of memory cells each for storing information data in a non-volatile manner;

operating mode designating signal generating circuitry for generating an operating mode designating signal designating a specific operating mode among said plurality of operating modes in accordance with a prescribed bit of a multi-bit address signal, said multi-bit address signal designating an address of a memory cell in said plurality of memory cells in a normal mode of operation; and operation control circuitry for generating a control signal for performing the specific operation mode designated according to said operating mode designating signal.

2. The semiconductor memory device according to claim 1, wherein said plurality of memory cells are divided into a plurality of banks addressable independently of each other, and said prescribed bit forms a bank address that specifies one of said plurality of banks.

3. The semiconductor memory device according to claim 1, further including a plurality of register circuit each storing specific data, wherein said plurality of memory cells are divided into a plurality of banks addressable independently of each other, and said plurality of operating modes include an external read mode for externally reading out data from a selected memory cell of said memory array and a plurality of register read modes for reading out the data individually from said plurality of register circuits, and said operating mode designating signal generating circuitry generates, as said operating mode designating signal, a signal specifying the external read mode for externally reading out the data from said memory array and a signal specifying, among the plurality of register read mode, an operating mode for externally reading out the data from one of said plurality of register circuits.

4. The semiconductor memory device according to claim 1, further including a plurality of register circuits each storing specific data, wherein said plurality of memory cells are divided into a plurality of banks addressable independently of each other, and said operating mode designating signal generating circuitry includes;

an internal control address generating circuit for taking in an external address signal according to an externally supplied command and generating an internal control address signal corresponding to the address signal taken in, the external address signal and the internal control signal corresponding to said multi-bit address signal, a detecting circuit for detecting coincidence in logical value between the prescribed bit of any applied external address signal and the prescribed bit of said internal control address signal, an information storing circuit for storing information specifying which one of said plurality of register circuits is to be selected, and a circuit for generating a first operating mode designating signal for selecting one of said plurality of register circuits according to the information stored in said information storing circuit when coincidence is detected by said detecting circuit, and generating a second operating mode designating signal for selecting data of a memory cell of a bank designated by said external address signal when non-coincidence is detected by said detecting circuit.

5. The semiconductor memory device according to claim 1, wherein said plurality of memory cells are divided into a plurality of banks addressable independently of each other, and said operating mode designating signal generating circuitry includes;

a plurality of mode setting signal generating circuits, provided corresponding to the respective banks, each for generating said operating mode designating signal when a corresponding bank is designated, said plurality of mode setting signal generating circuits allowing setting of designated operating modes, independently of each other.

6. The semiconductor memory device according to claim 1, said plurality of memory cells are divided into a plurality of banks addressable independently of each other; and said semiconductor memory device further comprises a read sense amplifier provided commonly to said plurality of banks for externally reading out data of a memory cell in a selected bank via a data output buffer.

7. The non-volatile semiconductor memory device according to claim 1, wherein said operating mode designating signal generating circuitry includes;

a circuit for storing specification information specifying an operating mode, a circuit for taking in an external address signal when a command is externally applied, and generating an internal control address signal corresponding to the external address signal taken in, a detecting circuit for detecting coincidence in logic value of the prescribed bit between any applied external address signal and said internal control address signal, and a circuit, upon application of said command, for outputting a signal designating an operating mode designated by said command as said operating mode designating signal according to a coincidence detection result of said detecting circuit and setting said specification information to a state designated by said command, and further for generating, upon detection of non-coincidence by said detecting circuit, the operating mode designating signal according to said specification information.

8. The non-volatile semiconductor memory device according to claim 1, wherein said operating mode designating signal generating circuitry includes a circuit for storing specification information that specifies an operating mode, a circuit for taking in an external address signal when a command is externally applied, and generating an internal control address signal corresponding to the external address signal taken in, a detecting circuit for detecting coincidence in logic value of said prescribed bit between any applied external address signal and said internal control address signal, and a circuit for generating the operating mode designating signal according to said specification information when the coincidence is detected by said detecting circuit, subsequently to application of said command.

9. The semiconductor memory device according to claim 1, wherein said plurality of memory cells are divided into a plurality of banks addressable independently of each other, and said operating mode designating signal generating circuitry includes;

an information storing circuit, provided corresponding to each of said plurality of banks, for storing specification information specifying an operating mode independently of other(s), and a circuit, provided corresponding to each of said plurality of banks, for generating the operating mode designating signal according to said specification information stored in a corresponding information storing circuit when an externally supplied address signal designates a corresponding bank.

10. The non-volatile semiconductor memory device according to claim 9, wherein said operating mode designating signal generating circuitry further includes;

a circuit for taking in an external address signal when a command is externally applied, and generating an internal control address signal corresponding to the external address signal taken in, and a circuit for detecting coincidence in logic value of the prescribed bits of said internal control address signal and said external address signal, and, according to a detection result, activating an operation of generating the operating mode designating signal according to said specification information.

11. The semiconductor device according to claim 1, wherein said operation mode designating signal generating circuitry stores the prescribed bit of a first multi-bit address signal externally supplied concurrently with a first command, and generates a first operation mode designating signal designating a first operation mode instructed by said first command when the prescribed bit of a second multi-bit address signal subsequently applied is the same in logic level as the prescribed bit of the first multi-bit address signal, and generates a second operation mode designating signal designating a second operation mode when the prescribed bit of a second multi-bit address signal subsequently applied is different in logic level from the prescribed bit of the first multi-bit address signal irrespectively of whether a second command is supplied.

* * * * *